(12) United States Patent
Kobayashi et al.

(10) Patent No.: US 8,815,414 B2
(45) Date of Patent: Aug. 26, 2014

(54) POLYMER COMPOUND AND POLYMER LIGHT EMITTING DEVICE USING THE SAME

(75) Inventors: Shigeya Kobayashi, Ibaraki (JP); Hidenobu Kakimoto, Ibaraki (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 338 days.

(21) Appl. No.: 12/441,906

(22) PCT Filed: Sep. 20, 2007

(86) PCT No.: PCT/JP2007/068909
§ 371 (c)(1),
(2), (4) Date: Mar. 19, 2009

(87) PCT Pub. No.: WO2008/038747
PCT Pub. Date: Apr. 3, 2008

(65) Prior Publication Data
US 2009/0315453 A1 Dec. 24, 2009

(30) Foreign Application Priority Data

Sep. 25, 2006 (JP) ................................. 2006-258449

(51) Int. Cl.
*H01L 51/54* (2006.01)

(52) U.S. Cl.
USPC ........... 428/690; 428/917; 313/504; 313/505; 313/506; 257/40; 257/E51.05; 257/E51.026; 257/E51.032; 564/26; 564/426; 564/434; 585/27

(58) Field of Classification Search
USPC .................. 428/690, 917; 313/504, 505, 506; 257/40, E51.05, E51.026, E51.032; 528/27; 564/26, 426, 434
See application file for complete search history.

(56) References Cited

U.S. PATENT DOCUMENTS

| | | | |
|---|---|---|---|
| 5,391,650 A | 2/1995 | Brennan et al. | |
| 2003/0165713 A1 | 9/2003 | Oguma et al. | |
| 2007/0102695 A1 | 5/2007 | Inbasekaran et al. | |

FOREIGN PATENT DOCUMENTS

| | | | | |
|---|---|---|---|---|
| JP | 2003-226744 A | 8/2003 | | |
| TW | 200517472 A | 6/2005 | | |
| WO | 2005/049689 A2 | 6/2005 | | |
| WO | WO 2005049689 | * | 6/2005 | ............. C08G 75/00 |

OTHER PUBLICATIONS

State Intellectual Property Office of People's Republic of China, "Office Action," issued in connection with Chinese Patent Application No. 200780035324.7, dated Dec. 11, 2012.
State Intellectual Property Office of People's Republic of China, "Rejection Decision," issued in connection with Chinese Patent Application No. 200780035324.7, dated Apr. 3, 2013.
European Patent Office, "Communication Pursuant to Article 94(3) EPC," issued in connection with European Patent Application No. 07 828 653.1, dated May 3, 2012.
Japanese Patent Office, "Notification of Reasons for Rejection," issued in connection with Japanese Patent Application No. 2007-245039, dated May 14, 2013.
Mark T. Bernius et al., "Progress with Light-Emitting Polymers," Advanced Materials, vol. 12, No. 23, Dec. 1, 2000, pp. 1737-1750.
Korean Intellectual Property Office, "Notice of Preliminary Rejection," issued in connection with Korean Patent Application No. 10-2009-7008204, dated Nov. 22, 2013.

* cited by examiner

*Primary Examiner* — Gregory Clark
(74) *Attorney, Agent, or Firm* — Sughrue Mion, PLLC

(57) ABSTRACT

A polymer compound having a repeating unit of the following formula (1):

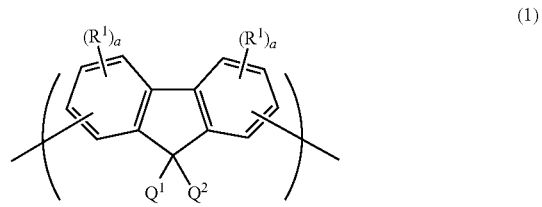

(1)

(wherein, $R^1$ represents a substituent, $Q^1$ and $Q^2$ represent a group containing a benzocyclobutane structure, a represents an integer of 0 to 3. When there exist a plurality of $R^1$s, these may be the same or different).

2 Claims, No Drawings

POLYMER COMPOUND AND POLYMER LIGHT EMITTING DEVICE USING THE SAME

TECHNICAL FIELD

The present invention relates to a polymer compound and a polymer light emitting device using the same.

BACKGROUND ART

A high molecular weight light emitting material soluble in solvent is capable of forming an organic layer of a light emitting device by an application method, responding to requirements such as enlargement of the area of the device, and the like. Therefore, there are recently suggested various polymer compounds capable of acting as a polymer light emitting material, polymer light emitting devices using them (for example, Advanced Materials Vol. 12 1737-1750 (2000) (p. 1742-1745)), and polymer compounds having a crosslinkable substituent (for example, WO 2005/49689 (p. 2-14 and 20-27)).

The conventional polymer compounds, however, have a problem that when used as a hole transporting layer in manufacturing a light emitting device, the resultant light emitting device shows no sufficient light emission efficiency (namely, light emission luminance per electric current).

DISCLOSURE OF THE INVENTION

Thus, An object of the present invention is to provide a polymer compound which, when used in a hole transporting layer, gives a light emitting device showing excellent light emission efficiency (namely, light emission luminance per electric current).

That is, the present invention provides a polymer compound having a repeating unit of the following formula (1):

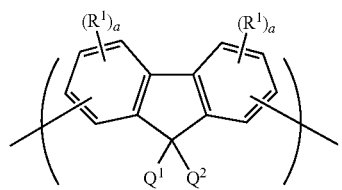

(1)

(wherein, $R^1$ represents a substituent, $Q^1$ and $Q^2$ represent a group containing a benzocyclobutane structure, and these may be the same or different. a represents an integer of 0 to 3. When there exist a plurality of $R^1$s, these may be the same or different).

MODES FOR CARRYING OUT THE INVENTION

The polymer compound of the present invention has a repeating unit of the above-described formula (1).

In the formula (1), the group containing a benzocyclobutane structure means a monovalent organic group containing a skeleton structure obtained by condensing cyclobutane to an aromatic ring such as benzene, naphthalene, anthracene, pyrene and the like.

The organic group includes specifically monovalent organic groups containing a benzocyclobutane structure, monovalent organic groups containing a naphthocyclobutane structure, monovalent organic groups containing an anthracenocyclobutane structure and monovalent organic groups containing a pyrenocyclobutane structure, and preferable are monovalent organic groups containing a benzocyclobutane structure. The organic group optionally has a substituent.

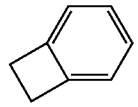

benzocyclobutane skeleton

As the repeating unit of the above-described formula (1), those of the following formula (1-1) are preferable from the standpoint of easiness of synthesis of a polymer compound, device properties and the like.

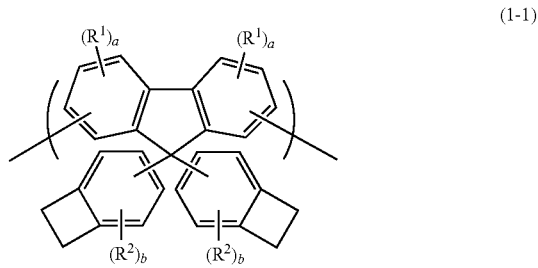

(1-1)

(wherein, $R^1$ and $R^2$ represent a substituent, and these may be the same or different. a and b represent each independently an integer of 0 to 3. When there exist a plurality of $R^1$s and $R^2$s, respectively, these may be the same or different).

The substituent represented by $R^1$, $R^2$ in the above-described formulae (1) and (1-1) includes alkyl groups, alkoxy groups, alkylthio groups, aryl groups, aryloxy groups, arylthio groups, aryl alkyl groups, aryl alkoxy groups, aryl alkylthio groups, arylalkenyl groups, arylalkynyl groups, amino group, substituted amino groups, silyl group, substituted silyl groups, halogen atoms, acyl group, acyloxy group, imine residue, amide group, acid imide groups, monovalent heterocyclic groups, carboxyl group, substituted carboxyl groups, nitro group, cyano group and the like. A hydrogen atom contained in these substituents may be substituted by a fluorine atom. Of these substituents, alkyl groups, alkoxy groups, alkylthio groups, aryl groups, aryloxy groups, arylthio groups, aryl alkyl groups, aryl alkoxy groups and monovalent heterocyclic groups are preferable, and alkyl groups, alkoxy groups, aryl groups and monovalent heterocyclic group are more preferable, from the standpoint of solubility of a polymer compound in an organic solvent and easiness of synthesis of a polymer compound.

In the above-described formula (1-1), a and b represent each independently an integer of 0 to 3, and it is preferable that a and b represent each independently 0 or 1. When there exist a plurality of $R^1$s and $R^2$s, respectively, these may be the same or different.

The alkyl group may be any of linear, branched or cyclic, and has a carbon number of usually about 1 to 20, preferably 3 to 20. Specific examples of the alkyl group include a methyl group, ethyl group, propyl group, i-propyl group, n-butyl group, i-butyl group, s-butyl group, t-butyl group, pentyl group, isoamyl group, hexyl group, cyclohexyl group, heptyl group, octyl group, 2-ethylhexyl group, nonyl group, decyl group, 3,7-dimethyloctyl group, lauryl group, trifluoromethyl group, pentafluoroethyl group, perfluorobutyl group, perfluorohexyl group, perfluorooctyl group and the like, and preferable due to a balance between heat resistance and standpoints of solubility of a polymer compound in an organic solvent, device properties, easiness of synthesis of a polymer compound and the like are a pentyl group, isoamyl group, hexyl group, octyl group, 2-ethylhexyl group, decyl group and 3,7-dimethyloctyl group.

The alkoxy group may be any of linear, branched or cyclic, and has a carbon number of usually about from 1 to 20, preferably 3 to 20. Specific examples of the alkoxy group include a methoxy group, ethoxy group, propyloxy group, i-propyloxy group, butoxy group, i-butoxy group, s-butoxy group, t-butoxy group, pentyloxy group, hexyloxy group, cyclohexyloxy group, heptyloxy group, octyloxy group, 2-ethylhexyloxy group, nonyloxy group, decyloxy group, 3,7-dimethyloctyloxy group, lauryloxy group, trifluoromethoxy group, pentafluoroethoxy group, perfluorobutoxy group, perfluorohexyloxy group, perfluorooctyloxy group and the like, and preferable due to a balance between heat resistance and standpoints of solubility of a polymer compound in an organic solvent, device properties, easiness of synthesis of a polymer compound and the like are a pentyloxy group, hexyloxy group, octyloxy group, 2-ethylhexyloxy group, decyloxy group and 3,7-dimethyloctyloxy group. Examples of the substituted alkoxy group include a methoxymethyloxy group, 2-methoxyethyloxy group and the like.

The alkylthio group may be any of linear, branched or cyclic, and has a carbon number of usually about from 1 to 20, preferably 3 to 20. Specific examples of the alkylthio group include a methylthio group, ethylthio group, propylthio group, i-propylthio group, butylthio group, i-butylthio group, s-butylthio group, t-butylthio group, pentylthio group, hexylthio group, cyclohexylthio group, heptylthio group, octylthio group, 2-ethylhexylthio group, nonylthio group, decylthio group, 3,7-dimethyloctylthio group, laurylthio group, trifluoromethylthio group and the like, and preferable due to a balance between heat resistance and standpoints of solubility of a polymer compound in an organic solvent, device properties, easiness of synthesis of a polymer compound and the like are a pentylthio group, hexylthio group, octylthio group, 2-ethylhexylthio group, decylthio group and 3,7-dimethyloctylthio group.

The aryl group is an atomic group obtained by removing one hydrogen atom from an aromatic hydrocarbon, and also includes those having a condensed ring, and those in which independent two or more benzene rings or condensed rings are connected directly or via a group such as vinylene and the like. The aryl group has a carbon number of usually about from 6 to 60, preferably 7 to 48. Specific examples of the aryl group include a phenyl group, $C_1$ to $C_{12}$ alkoxyphenyl groups ("$C_1$ to $C_{12}$ alkoxy" means that the carbon number of the alkoxy portion is 1 to 12, being applicable also in the following descriptions), $C_1$ to $C_{12}$ alkylphenyl groups ("$C_1$ to $C_{12}$ alkyl" means that the carbon number of the alkyl portion is 1 to 12, being applicable also in the following descriptions), 1-naphtyl group, 2-naphtyl group, 1-anthracenyl group, 2-anthracenyl group, 9-anthracenyl group, pentafluorophenyl group and the like, and preferable from the standpoint of solubility of a polymer compound in an organic solvent, device properties, easiness of synthesis of a polymer compound and the like are $C_1$ to $C_{12}$ alkoxyphenyl groups and $C_1$ to $C_{12}$ alkylphenyl groups. Specific examples of the $C_1$ to $C_{12}$ alkoxyphenyl group include a methoxyphenyl group, ethoxyphenyl group, propyloxyphenyl group, i-propyloxyphenyl group, butoxyphenyl group, i-butoxyphenyl group, t-butoxyphenyl group, pentyloxyphenyl group, hexyloxyphenyl group, cyclohexyloxyphenyl group, heptyloxyphenyl group, octyloxyphenyl group, 2-ethylhexyloxyphenyl group, nonyloxyphenyl group, decyloxyphenyl group, 3,7-dimethyloctyloxyphenyl group, lauryloxyphenyl group and the like. Specific examples of the $C_1$ to $C_{12}$ alkylphenyl group include a methylphenyl group, ethylphenyl group, dimethylphenyl group, propylphenyl group, mesityl group, methylethylphenyl group, i-propylphenyl group, butylphenyl group, i-butylphenyl group, s-butylphenyl group, t-butylphenyl group, pentylphenyl group, isoamylphenyl group, hexylphenyl group, heptylphenyl group, octylphenyl group, nonylphenyl group, decylphenyl group, dodecylphenyl group and the like.

The aryloxy group has a carbon number of usually about from 6 to 60, preferably 6 to 48. Specific examples of the aryloxy group include a phenoxy group, $C_1$ to $C_{12}$ alkoxyphenoxy groups, $C_1$ to $C_{12}$ alkylphenoxy groups, 1-naphthyloxy group, 2-naphthyloxy group, pentafluorophenyloxy group and the like, and preferable from the standpoint of solubility of a polymer compound in an organic solvent, device properties, easiness of synthesis of a polymer compound and the like are $C_1$ to $C_{12}$ alkoxyphenoxy groups and $C_1$ to $C_{12}$ alkylphenoxy groups. Specific examples of the $C_1$ to $C_{12}$ alkoxyphenoxy group include a methoxyphenoxy group, ethoxyphenoxy group, propyloxyphenoxy group, i-propyloxyphenoxy group, butoxyphenoxy group, i-butoxyphenoxy group, s-butoxyphenoxy group, t-butoxyphenoxy group, pentyloxyphenoxy group, hexyloxyphenoxy group, cyclohexyloxyphenoxy group, heptyloxyphenoxy group, octyloxyphenoxy group, 2-ethylhexyloxyphenoxy group, nonyloxyphenoxy group, decyloxyphenoxy group, 3,7-dimethyloctyloxyphenoxy group, lauryloxyphenoxy group and the like. Specific examples of the $C_1$ to $C_{12}$ alkylphenoxy group include a methylphenoxy group, ethylphenoxy group, dimethylphenoxy group, propylphenoxy group, 1,3,5-trimethylphenoxy group, methylethylphenoxy group, i-propylphenoxy group, butylphenoxy group, i-butylphenoxy group, t-butylphenoxy group, pentylphenoxy group, isoamylphenoxy group, hexylphenoxy group, heptylphenoxy group, octylphenoxy group, nonylphenoxy group, decylphenoxy group, dodecylphenoxy group and the like.

The arylthio group has a carbon number of usually about from 6 to 60. Specific examples of the arylthio group include a phenylthio group, $C_1$ to $C_{12}$ alkoxyphenylthio groups, $C_1$ to $C_{12}$ alkylphenylthio groups, 1-naphthylthio group, 2-naphthylthio group, pentafluorophenylthio group and the like, and preferable from the standpoint of solubility of a polymer compound in an organic solvent, device properties, easiness of synthesis of a polymer compound and the like are $C_1$ to $C_{12}$ alkoxyphenylthio groups and $C_1$ to $C_{12}$ alkylphenylthio groups.

The aryl alkyl group has a carbon number of usually about from 7 to 60, preferably 7 to 48. Specific examples of the aryl alkyl group include phenyl-$C_1$ to $C_{12}$ alkyl groups, $C_1$ to $C_{12}$ alkoxyphenyl-$C_1$ to $C_{12}$ alkyl groups, $C_1$ to $C_{12}$ alkylphenyl-$C_1$ to $C_{12}$ alkyl groups, 1-naphthyl $C_1$ to $C_{12}$ alkyl groups, 2-naphthyl $C_1$ to $C_{12}$ alkyl groups and the like, and preferable from the standpoint of solubility of a polymer compound in an organic solvent, device properties, easiness of synthesis of a polymer compound and the like are $C_1$ to $C_{12}$ alkoxyphenyl-$C_1$ to $C_{12}$ alkyl groups and $C_1$ to $C_{12}$ alkylphenyl-$C_1$ to $C_{12}$ alkyl groups.

The aryl alkoxy group has a carbon number of usually about from 7 to 60, preferably 7 to 48. Specific examples of the aryl alkoxy group include phenyl-$C_1$ to $C_{12}$ alkoxy groups such as a phenylmethoxy group, phenylethoxy group, phenylbutoxy group, phenylpentyloxy group, phenylhexyloxy group, phenylheptyloxy group, phenyloctyloxy group and the like, $C_1$ to $C_{12}$ alkoxyphenyl-$C_1$ to $C_{12}$ alkoxy groups, $C_1$ to $C_{12}$ alkylphenyl-$C_1$ to $C_{12}$ alkoxy groups, 1-naphthyl $C_1$ to $C_{12}$ alkoxy groups, 2-naphthyl $C_1$ to $C_{12}$ alkoxy groups and the like, and preferable from the standpoint of solubility of a polymer compound in an organic solvent, device properties, easiness of synthesis of a polymer compound and the like are $C_1$ to $C_{12}$ alkoxyphenyl-$C_1$ to $C_{12}$ alkoxy groups and $C_1$ to $C_{12}$ alkylphenyl-$C_1$ to $C_{12}$ alkoxy groups.

The aryl alkylthio group has a carbon number of usually about from 7 to 60, preferably 7 to 48. Specific examples of the aryl alkylthio group include phenyl-$C_1$ to $C_{12}$ alkylthio groups, $C_1$ to $C_{12}$ alkoxyphenyl-$C_1$ to $C_{12}$ alkylthio groups, $C_1$ to $C_{12}$ alkylphenyl-$C_1$ to $C_{12}$ alkylthio groups, 1-naphthyl $C_1$ to $C_{12}$ alkylthio groups, 2-naphthyl $C_1$ to $C_{12}$ alkylthio groups and the like, and preferable from the standpoint of solubility of a polymer compound in an organic solvent, device properties, easiness of synthesis of a polymer compound and the like are $C_1$ to $C_{12}$ alkoxyphenyl-$C_1$ to $C_{12}$ alkylthio groups and $C_1$ to $C_{12}$ alkylphenyl-$C_1$ to $C_{12}$ alkylthio groups.

The arylalkenyl group has a carbon number of usually about from 8 to 60. Specific examples of the arylalkenyl group include phenyl-$C_2$ to $C_{12}$alkenyl groups ("$C_2$ to $C_{12}$ alkenyl" means that the carbon number of the alkenyl portion is 2 to 12, being applicable also in the following descriptions), $C_1$ to $C_{12}$ alkoxyphenyl-$C_2$ to $C_{12}$ alkenyl groups, $C_1$ to $C_{12}$ alkylphenyl-$C_2$ to $C_{12}$ alkenyl groups, 1-naphthyl $C_2$ to $C_{12}$ alkenyl groups, 2-naphthyl $C_2$ to $C_{12}$ alkenyl groups and the like, and preferable from the standpoint of solubility of a polymer compound in an organic solvent, device properties, easiness of synthesis of a polymer compound and the like are $C_1$ to $C_{12}$ alkoxyphenyl-$C_2$ to $C_{12}$ alkenyl groups and $C_2$ to $C_{12}$ alkylphenyl-$C_1$ to $C_{12}$ alkenyl groups.

The arylalkynyl group has a carbon number of usually about from 8 to 60. Specific examples of the arylalkynyl group include phenyl-$C_2$ to $C_{12}$ alkynyl groups ("$C_2$ to $C_{12}$ alkynyl" means that the carbon number of the alkynyl portion is 2 to 12, being applicable also in the following descriptions), $C_1$ to $C_{12}$ alkoxyphenyl-$C_2$ to $C_{12}$ alkynyl groups, $C_1$ to $C_{12}$ alkylphenyl-$C_2$ to $C_{12}$ alkynyl groups, 1-naphthyl $C_2$ to $C_{12}$ alkynyl groups, 2-naphthyl $C_2$ to $C_{12}$ alkynyl groups and the like, and preferable from the standpoint of solubility of a polymer compound in an organic solvent, device properties, easiness of synthesis of a polymer compound and the like are $C_1$ to $C_{12}$ alkoxyphenyl-$C_2$ to $C_{12}$ alkynyl groups and $C_1$ to $C_{12}$ alkylphenyl-$C_2$ to $C_{12}$ alkynyl groups.

The substituted amino group includes amino groups substituted with one or two groups selected from alkyl groups, aryl groups, aryl alkyl groups and monovalent heterocyclic groups. These alkyl groups, aryl groups, aryl alkyl groups and monovalent heterocyclic groups optionally have a substituent. The carbon number of the substituted amino group is usually about from 1 to 60, preferably 2 to 48, not including the carbon number of the substituent. Specific examples of the substituted amino group include a methylamino group, dimethylamino group, ethylamino group, diethylamino group, propylamino group, dipropylamino group, i-propylamino group, diisopropylamino group, butylamino group, i-butylamino group, s-butylamino group, t-butylamino group, pentylamino group, hexylamino group, cyclohexylamino group, heptylamino group, octylamino group, 2-ethylhexylamino group, nonylamino group, decylamino group, 3,7-dimethyloctylamino group, laurylamino group, cyclopentylamino group, dicyclopentylamino group, cyclohexylamino group, dicyclohexylamino group, pyrrolidyl group, piperidyl group, ditrifluoromethylamino group, phenylamino group, diphenylamino group, $C_1$ to $C_{12}$ alkoxyphenylamino groups, di($C_1$ to $C_{12}$ alkoxyphenyl)amino groups, di($C_1$ to $C_{12}$ alkylphenyl)amino groups, 1-naphthylamino group, 2-naphthylamino group, pentafluorophenylamino group, pyridylamino group, pyridazinylamino group, pyrimidylamino group, pyrazylamino group, triazylamino group, phenyl-$C_1$ to $C_{12}$ alkylamino groups, $C_1$ to $C_{12}$ alkoxyphenyl-$C_1$ to $C_{12}$ alkylamino groups, $C_1$ to $C_{12}$ alkylphenyl-$C_1$ to $C_{12}$ alkylamino groups, di($C_1$ to $C_{12}$ alkoxyphenyl-$C_1$ to $C_{12}$ alkyl)amino groups, di($C_1$ to $C_{12}$ alkylphenyl-$C_1$ to $C_{12}$ alkyl) amino groups, 1-naphthyl $C_1$ to $C_{12}$ alkylamino groups, 2-naphthyl $C_1$ to $C_{12}$ alkylamino groups and the like.

The substituted silyl group includes silyl groups substituted with one, two or three groups selected from alkyl groups, aryl groups, aryl alkyl groups and monovalent heterocyclic groups. The carbon number of the substituted silyl group is usually about from 1 to 60, preferably 3 to 48. These alkyl groups, aryl groups, aryl alkyl groups and monovalent heterocyclic groups optionally have a substituent. Specific examples of the substituted silyl group include a trimethylsilyl group, triethylsilyl group, tripropylsilyl group, tri-i-propylsilyl group, dimethyl i-propylisilyl group, diethyl i-propylsilyl group, t-butylsilyldimethylsilyl group, pentyldimethylsilyl group, hexyldimethylsilyl group, heptyldimethylsilyl group, octyldimethylsilyl group, 2-ethylhexyldimethylsilyl group, nonyldimethylsilyl group, decyldimethylsilyl group, 3,7-dimethyloctyl-dimethylsilyl group, lauryldimethylsilyl group, phenyl-$C_1$ to $C_{12}$ alkylsilyl groups, $C_1$ to $C_{12}$ alkoxyphenyl-$C_1$ to $C_{12}$ alkylsilyl groups, $C_1$ to $C_{12}$ alkylphenyl-$C_1$ to $C_{12}$ alkylsilyl groups, 1-naphthyl $C_1$ to $C_{12}$ alkylsilyl groups, 2-naphthyl $C_1$ to $C_{12}$ alkylsilyl groups, phenyl-$C_1$ to $C_{12}$ alkyldimethylsilyl groups, triphenylsilyl group, tri-p-xylylsilyl group, tribenzylsilyl group, diphenylmethylsilyl group, t-butyldiphenyl-silyl group, dimethylphenylsilyl group and the like.

Examples of the halogen atom include a fluorine atom, chlorine atom, bromine atom and iodine atom.

The acyl group has a carbon number of usually about from 2 to 20, preferably 2 to 18. Specific examples of the acyl group include an acetyl group, propionyl group, butylyl group, isobutylyl group, pivaloyl group, benzoyl group, trifluoroacetyl group, pentafluorobenzoyl group and the like.

The acyloxy group has a carbon number of usually about from 2 to 20, preferably 2 to 18. Specific examples of the acyloxy group include an acetoxy group, propionyloxy group, butylyloxy group, isobutylyloxy group, pivaloyloxy group, benzoyloxy group, trifluoroacetyloxy group, pentafluorobenzoyloxy group and the like.

The imine residue includes residues obtained by removing one hydrogen atom from imine compounds (meaning organic compounds having —N=C— in the molecule. Examples thereof include aldimines, ketimines, and compounds obtained by substituting a hydrogen atom on N in these compounds by an alkyl group or the like). The imine residue has a carbon number of usually about from 2 to 20, preferably 2 to 18. Specific examples of the imine residue include groups of the following structural formulae, and the like.

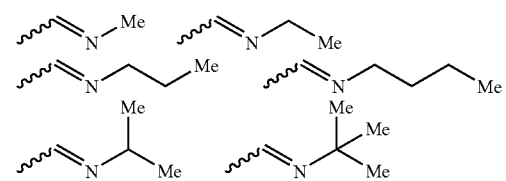

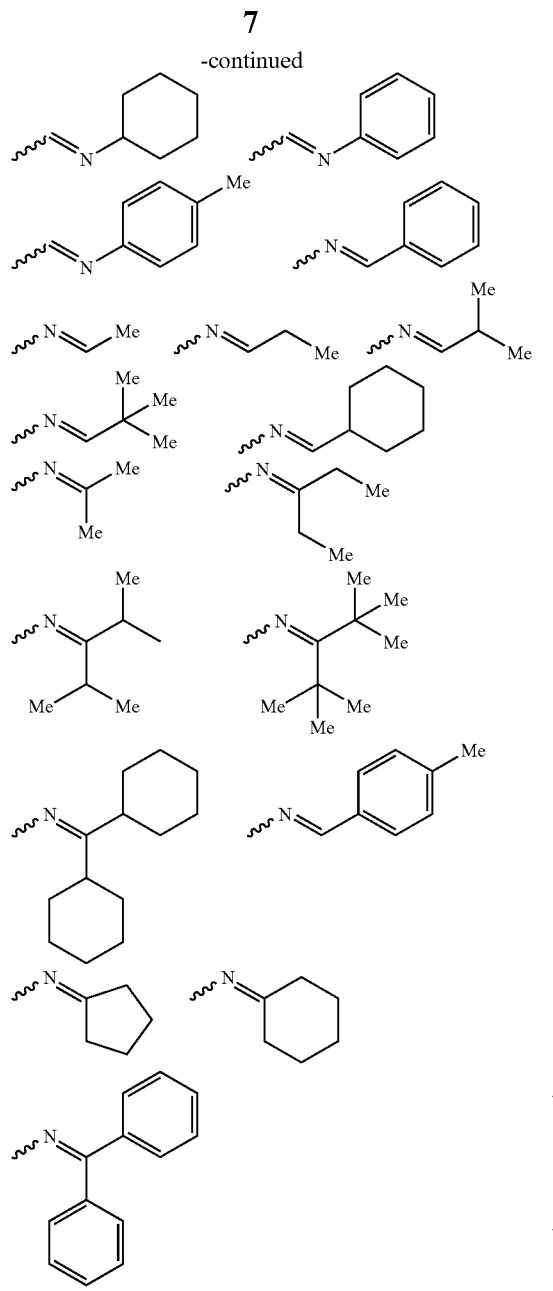

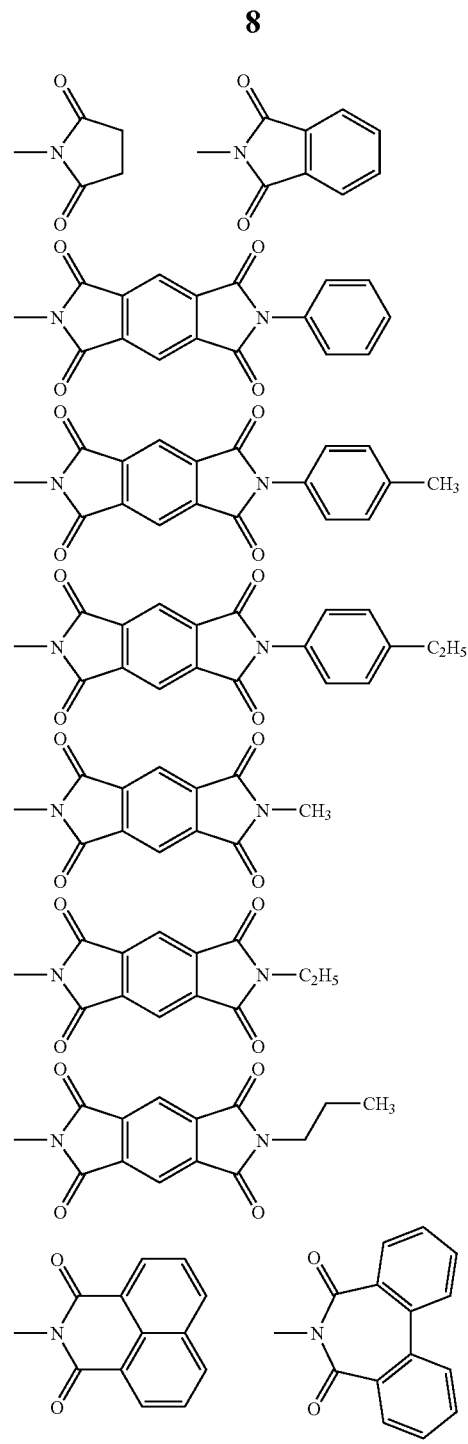

(in the formulae, Me represents a methyl group. The wavy line represents a connecting bond, and means possibility of a geometric isomer such as a cis isomer, trans isomer and the like depending on the kind of the imine residue).

The amide group has a carbon number of usually about from 2 to 20, preferably 2 to 18. Specific examples of the amide group include a formamide group, acetamide group, propioamide group, butyroamide group, benzamide group, trifluoroacetamide group, pentafluorobenzamide group, diformamide group, diacetamide group, dipropioamide group, dibutyroamide group, dibenzamide group, ditrifluoroacetamide group, dipentafluorobenzamide group and the like.

As the acid imide group, residues obtained by removing from an acid imide a hydrogen atom bonded to its nitrogen atom are mentioned, and the carbon number thereof is about from 4 to 20. Specific examples of the acid imide group include the following groups, and the like.

The monovalent heterocyclic group refers to an atomic group remaining after removing one hydrogen atom from a heterocyclic compound, and the carbon number of the monovalent heterocyclic group is usually about from 4 to 60, preferably 4 to 20. The carbon number of the monovalent heterocyclic group does not include the carbon number of the substituent. The above-described heterocyclic compound refers to organic compounds having a cyclic structure in which elements constituting the ring include not only a carbon atom, but also a hetero atom such as oxygen, sulfur, nitrogen, phosphorus, boron, silicon and the like contained in the ring. Specific examples of the monovalent heterocyclic group include a thienyl group, $C_1$ to $C_{12}$ alkylthienyl groups, pyrrolyl group, furyl group, pyridyl group, $C_1$ to $C_{12}$ alkylpyridyl groups, piperidyl group, quinolyl group, isoquinolyl group and the like, and preferable are a thienyl group, $C_1$ to $C_{12}$ alkylthienyl groups, pyridyl group and $C_1$ to $C_{12}$ alkylpyridyl groups.

The substituted carboxyl group includes carboxyl groups substituted with an alkyl group, aryl group, aryl alkyl group or monovalent heterocyclic groups. The above-described alkyl group, aryl group, aryl alkyl group or monovalent heterocyclic group optionally has a substituent.

The carbon number of the substituted carboxyl group is usually about from 2 to 60, preferably 2 to 48. The carbon number of the substituted carboxyl group does not include the carbon number of the substituent. Specific examples of the substituted carboxyl group include a methoxycarbonyl group, ethoxycarbonyl group, propoxycarbonyl group, i-propoxycarbonyl group, butoxycarbonyl group, i-butoxycarbonyl group, s-butoxycarbonyl group, t-butoxycarbonyl group, pentyloxycarbonyl group, hexyloxycarbonyl group, cyclohexyloxycarbonyl group, heptyloxycarbonyl group, octyloxycarbonyl group, q2-ethylhexyloxycarbonyl group, nonyloxycarbonyl group, decyloxycarbonyl group, 3,7-dimethyloctyloxycarbonyl group, dodecyloxycarbonyl group, trifluoromethoxycarbonyl group, pentafluoroethoxycarbonyl group, perfluorobutoxycarbonyl group, perfluorohexyloxycarbonyl group, perfluorooctyloxycarbonyl group, phenoxycarbonyl group, naphthoxycarbonyl group, pyridyloxycarbonyl group and the like.

The above-described polymer compound may contain a repeating unit other than the repeating unit of the above-described formula (1). The proportion of the repeating unit of the formula (1) is preferably 0.1 to 99 mol %, more preferably 1 to 30 mol % based on all repeating units in the above-described polymer compound, from the standpoint of light emission efficiency.

As the repeating unit of the above-described formula (1-1), preferable, from the standpoint of easiness of synthesis of a polymer compound, device properties and the like, are units of the following formula (1-2):

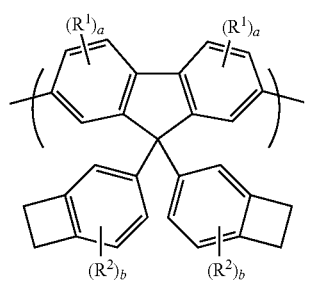
(1-2)

(wherein, $R^1$, $R^2$, a and b represent the same meanings as described above), further preferable are units of the following formula (1-3):

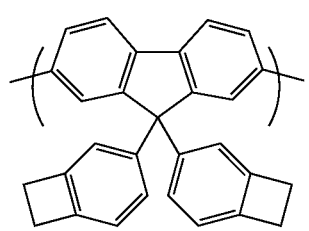
(1-3)

The polymer compound of the present invention may further contain one or more repeating units of the following formula (2):

$$—Ar^1—  \quad (2)$$

(wherein, $Ar^1$ represents an arylene group, divalent aromatic amine group or divalent heterocyclic group. Here, the arylene group does not include groups of the above-described formula (1)).

In the above-described formula (2), the arylene group represented by $Ar^1$ is an atomic group obtained by removing two hydrogen atoms from an aromatic hydrocarbon, and also includes those having a condensed ring, and those in which independent two or more benzene rings or condensed rings are connected directly or via a group such as vinylene and the like. The arylene group optionally has a substituent. The carbon number of a portion of the arylene group excluding the substituent is usually about from 6 to 60, preferably 6 to 20. The total carbon number of the arylene group including the substituent is usually about from 6 to 100.

Examples of the arylene group represented by $Ar^1$ include phenylene groups (for example, the following formulae 1 to 3), naphthalenediyl groups (for example, the following formulae 4 to 13), anthracene-diyl groups (for example, the following formulae 14 to 19), biphenyl-diyl groups (for example, the following formulae 20 to 25), terphenyl-diyl groups (for example, the following formulae 26 to 28), condensed ring compound groups (for example, the following formulae 29 to 35), fluorine-diyl groups (for example, the following formulae 36 to 38), stilbene-diyl groups (the following formulae 39 to 42), distilbene-diyl groups (for example, the following formulae 43, 44), benzofluorene-diyl groups (for example, the following formulae A-1 to A-3), dibenzofluorene-diyl groups (for example, the following formula A-4), and the like.

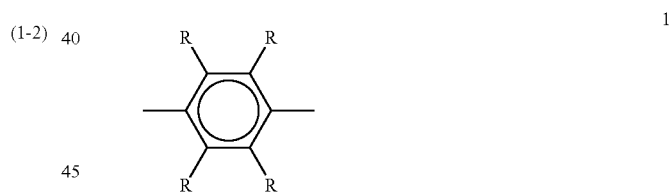
1

2

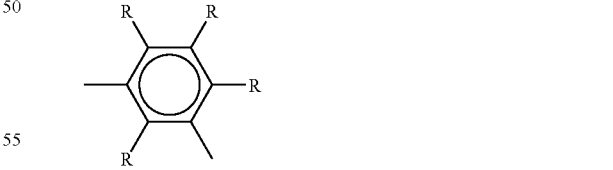
3

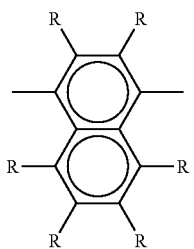
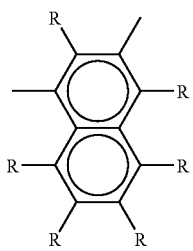
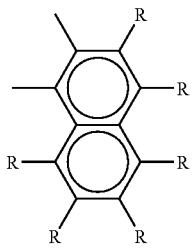
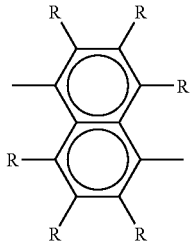
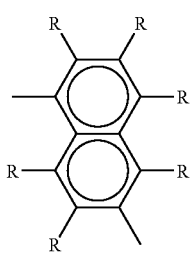
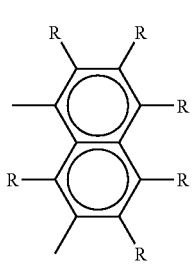
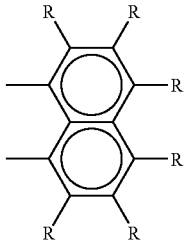
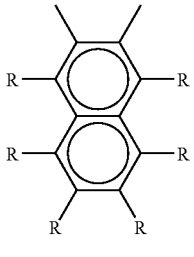
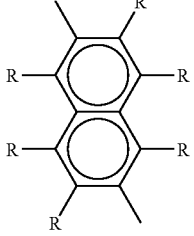
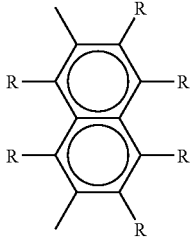
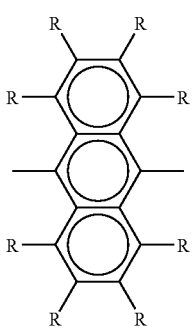
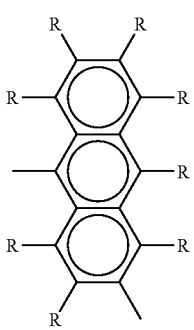

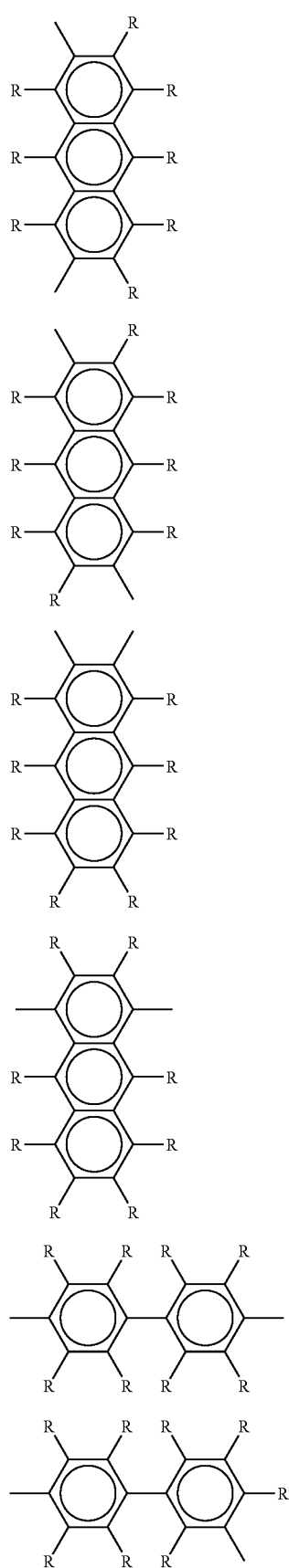
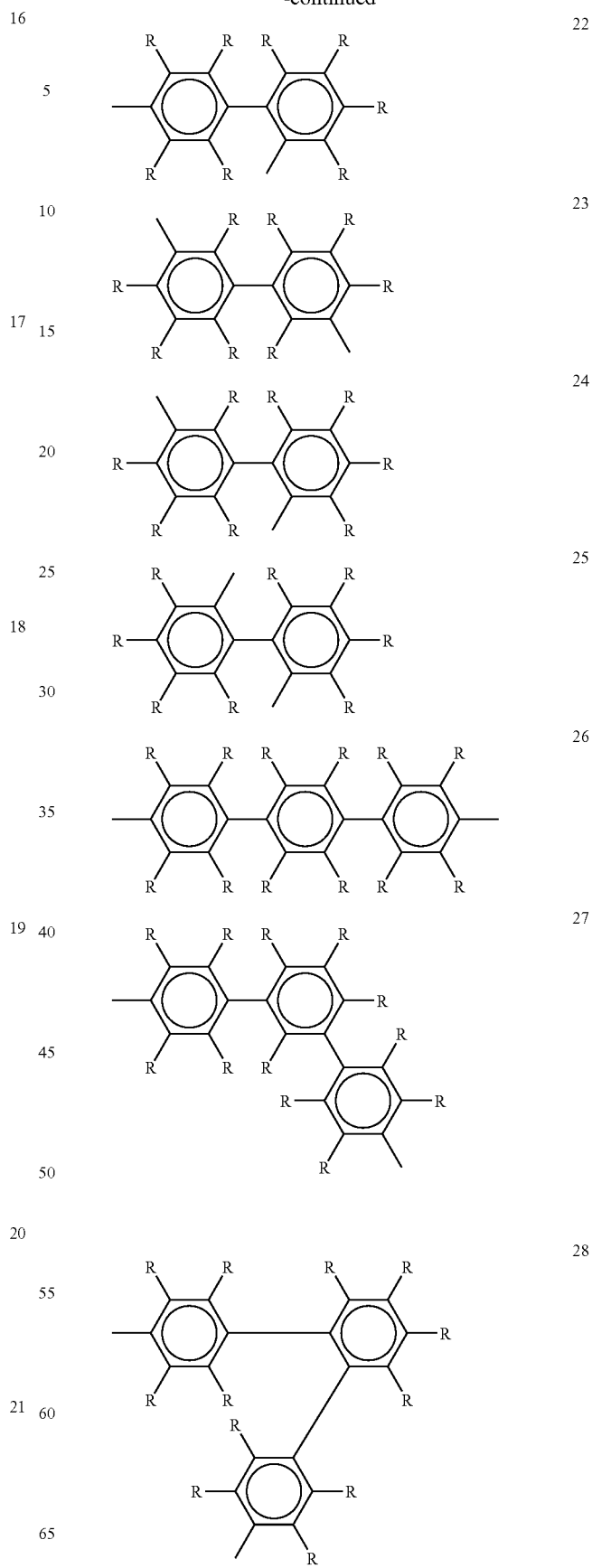

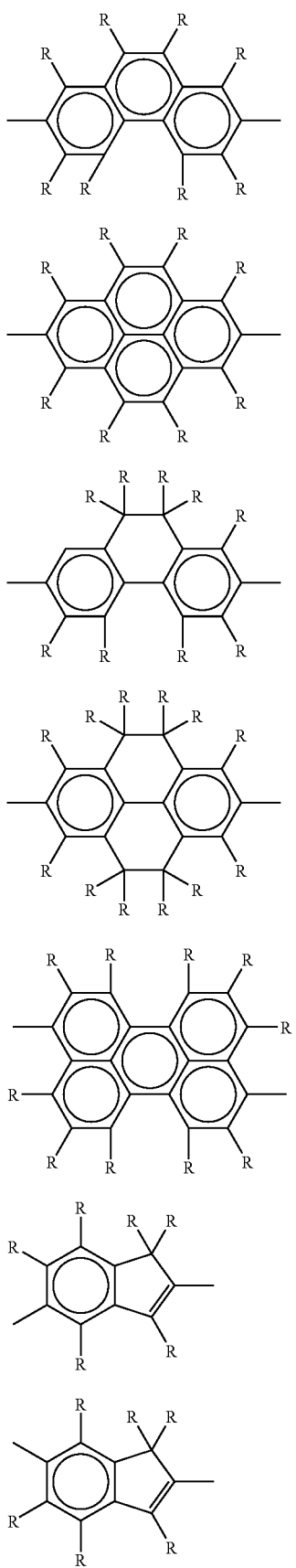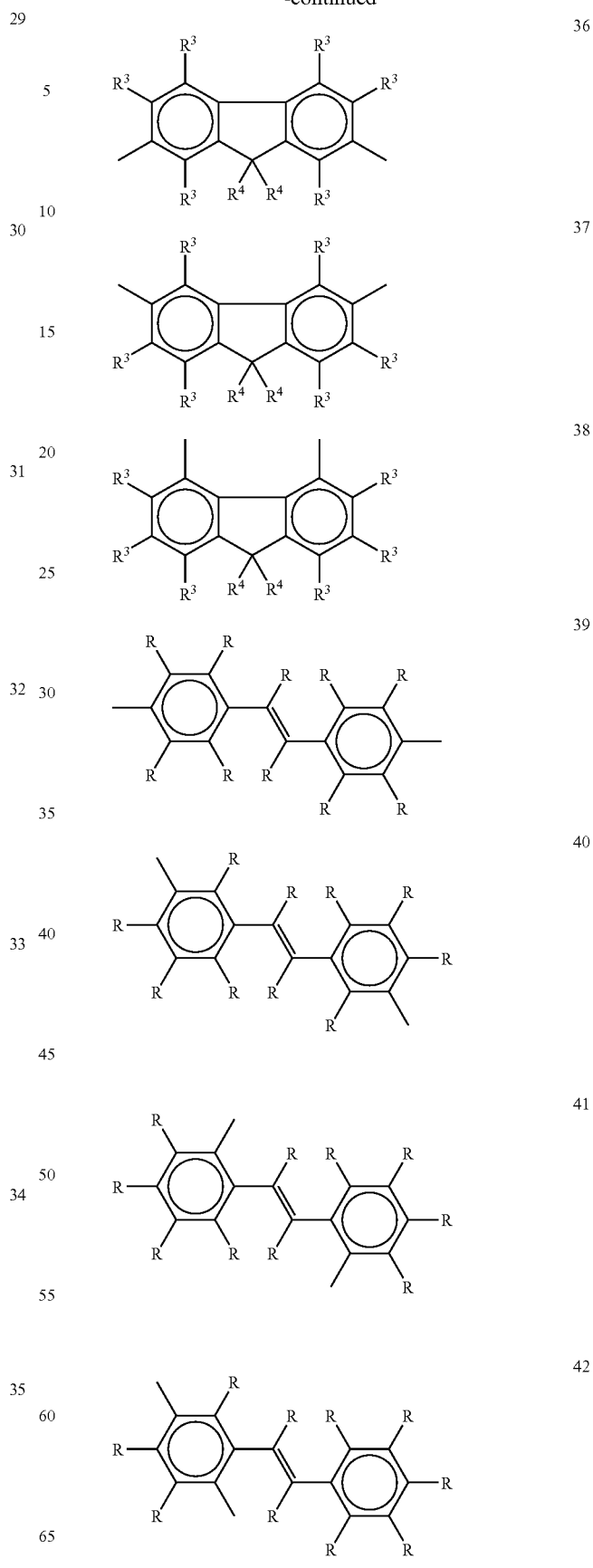

-continued

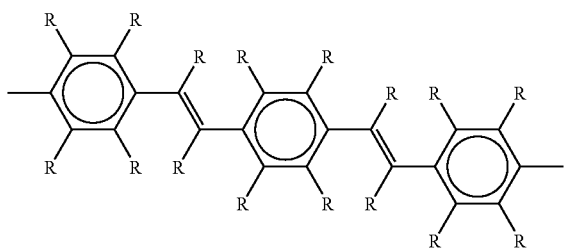
43

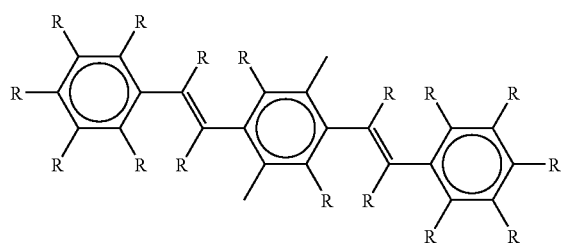
44

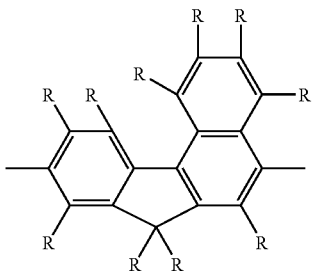
A-1

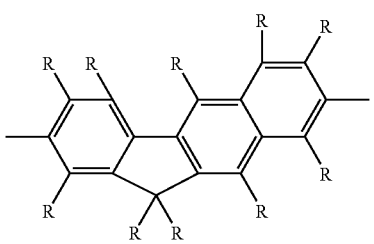
A-2

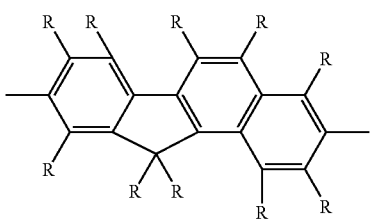
A-3

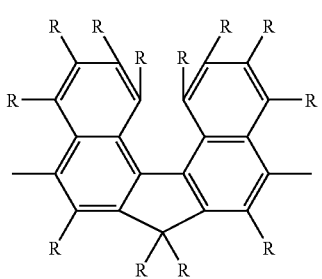
A-4

(in the formulae, Rs represent independently a hydrogen atom or substituent, $R^3$ represents a substituent, $R^4$ represents a hydrogen atom or a substituent. The substituents represented by $R^3$ and $R^4$ include alkyl groups, alkoxy groups, alkylthio groups, aryl groups, aryloxy groups, arylthio groups, aryl alkyl groups, aryl alkoxy groups, aryl alkylthio groups, arylalkenyl groups, arylalkynyl groups, amino group, substituted amino groups, silyl group, substituted silyl groups, halogen atoms, acyl group, acyloxy group, imine residue, amide group, acid imide groups, monovalent heterocyclic groups, carboxyl group, substituted carboxyl groups, nitro group and cyano group. Here, $R^4$ is not a group containing a benzocyclobutane structure. The substituents represented by $R^3$ and $R^4$ are specifically the same as explained and exemplified for $R^1$ in the above descriptions).

Examples of the substituent represented by R in the above-described formulae 1 to 35, 39 to 44 and A-1 to A-4 include alkyl groups, alkoxy groups, alkylthio groups, aryl groups, aryloxy groups, arylthio groups, aryl alkyl groups, aryl alkoxy groups, aryl alkylthio groups, arylalkenyl groups, arylalkynyl groups, amino group, substituted amino groups, silyl group, substituted silyl groups, halogen atoms, acyl group, acyloxy group, imine residue, amide group, acid imide groups, monovalent heterocyclic groups, carboxyl group, substituted carboxyl groups, cyano group and the like. A hydrogen atom contained in these substituents may be substituted by a fluorine atom. These groups, residues and atoms are the same as explained and exemplified in the column of the substituent represented by the above-described $R^1$. In the substituents represented by R, it is preferable that at least one R is other than a hydrogen atom from the standpoint of solubility of a polymer compound in an organic solvent and device properties. The substituent represented by R is preferably an alkyl group, alkoxy group, alkylthio group, aryl group, aryloxy group, arylthio group, aryl alkyl group, aryl alkoxy group or monovalent heterocyclic group, and more preferably an alkyl group, alkoxy group or aryl group.

The divalent heterocyclic group represented by $Ar^1$ means an atomic group remaining after removal of two hydrogen atoms from a heterocyclic compound. The divalent heterocyclic group optionally has a substituent. The above-described heterocyclic compound refers to organic compounds having a cyclic structure in which elements constituting the ring include not only a carbon atom, but also a hetero atom such as oxygen, sulfur, nitrogen, phosphorus, boron, arsenic and the like contained in the ring. Of the divalent heterocyclic groups, aromatic heterocyclic groups are preferable. The carbon number of a portion of the divalent heterocyclic group excluding the substituent is usually about from 3 to 60. The total carbon number of the divalent heterocyclic group including the substituent is usually about from 3 to 100.

Examples of the divalent heterocyclic group represented by $Ar_1$ include divalent heterocyclic groups containing nitrogen as a hetero atom such as pyridine-diyl groups (for example, the following formulae 45 to 50), diazaphenylene groups (for example, the following formulae 51 to 54), quinolinediyl groups (for example, the following formulae 55 to 69), quinoxalinediyl groups (for example, the following formulae 70 to 74), acridinediyl groups (for example, the following formulae 75 to 78), bipyridyldiyl groups (for example, the following formulae 79 to 81), phenanthrolinediyl groups (for example, the following formulae 82 to 84), groups having a carbazole structure (for example, the following formulae 85 to 87) and the like; 5-membered heterocyclic groups containing as a hetero atom oxygen, silicon, nitrogen, sulfur, selenium and the like (for example, the following formulae 88 to 92); 5-membered condensed heterocyclic groups containing as a hetero atom oxygen, silicon, nitrogen, selenium and the like (for example, the following formulae 93 to 103); 5-membered heterocyclic groups containing as a hetero atom oxygen, silicon, nitrogen, sulfur, selenium and the like, having bonding at the α-position of its hetero atom to form a dimer or oligomer (for example, the following formulae 104 to 105); 5-membered heterocyclic groups containing as a hetero atom oxygen, silicon, nitrogen, sulfur, selenium and the like, bonding at the α-position of its hetero atom to a phenyl group (for example, the following formulae 106 to 112); 5-membered condensed heterocyclic groups containing as a hetero atom oxygen, nitrogen, sulfur and the like, substituted with a phenyl group, furyl group or thienyl group (for example, the following formulae 113 to 118), and the like.

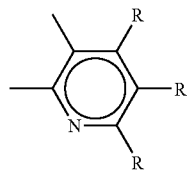

45

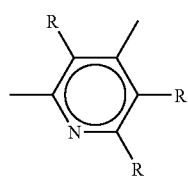

46

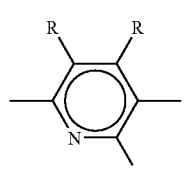

47

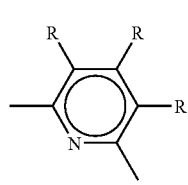

48

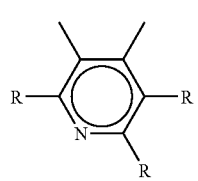

49

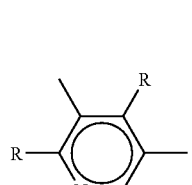

50

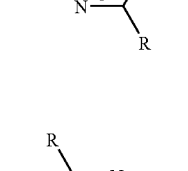

51

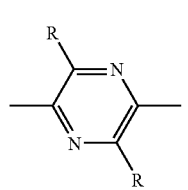

-continued

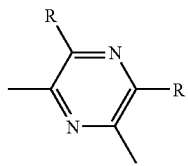

52

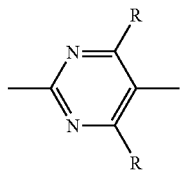

53

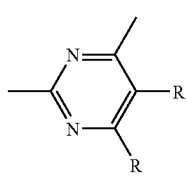

54

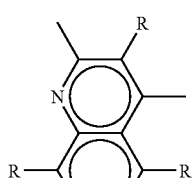

55

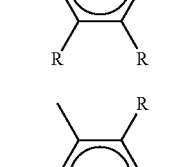

56

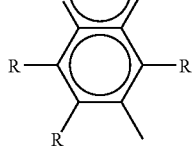

57

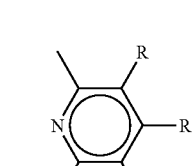

58

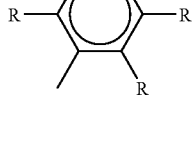

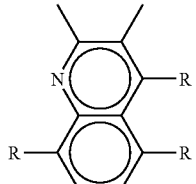

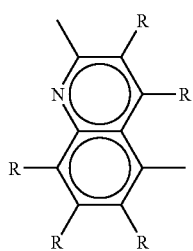 59
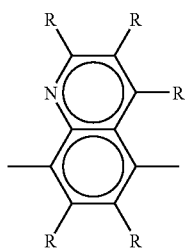 60
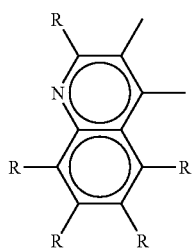 61
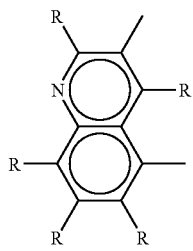 62
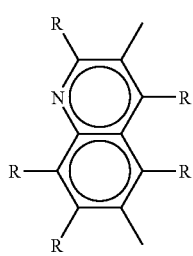 63
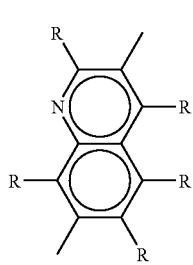 64
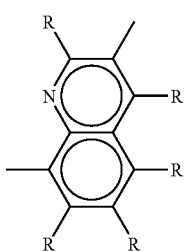 65
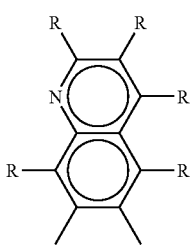 66
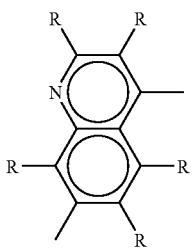 67
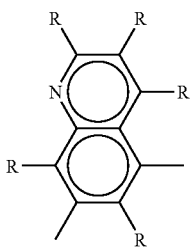 68
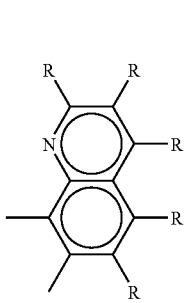 69
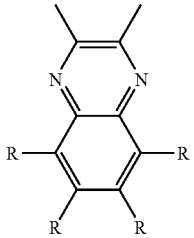 70

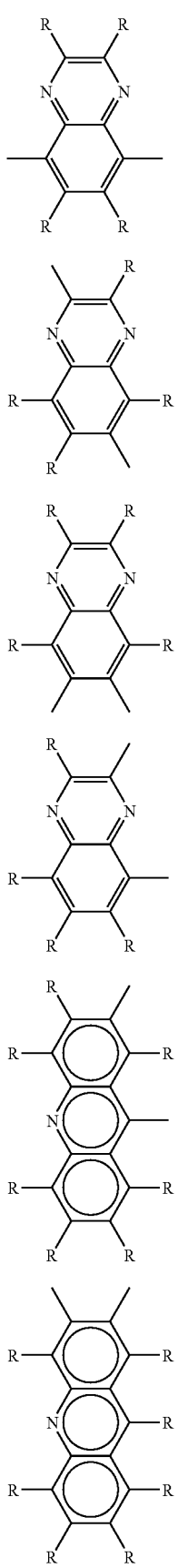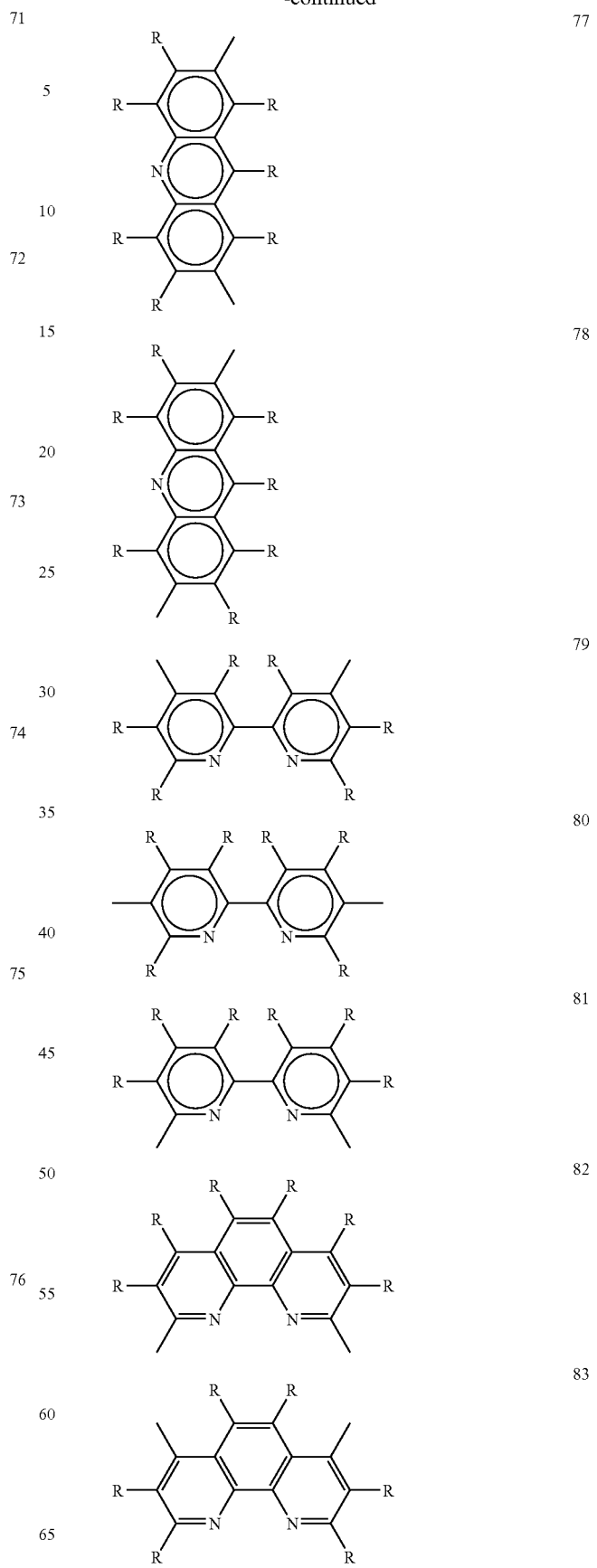

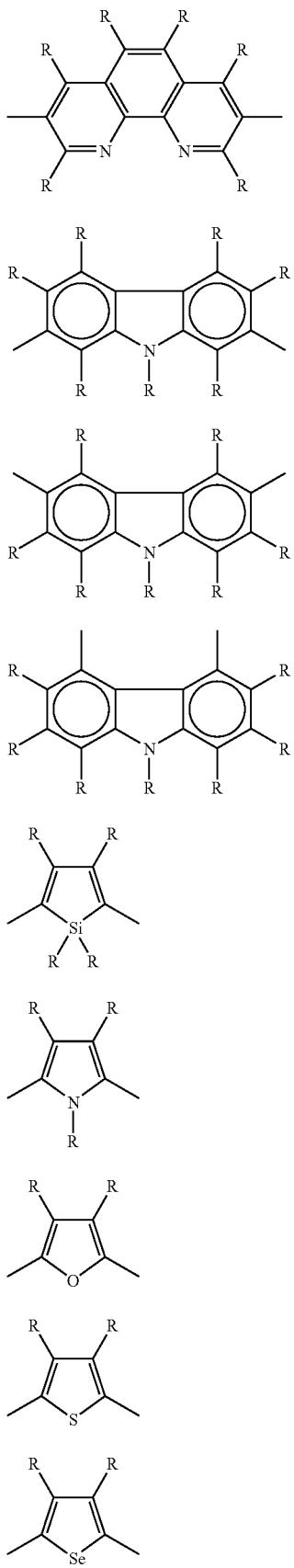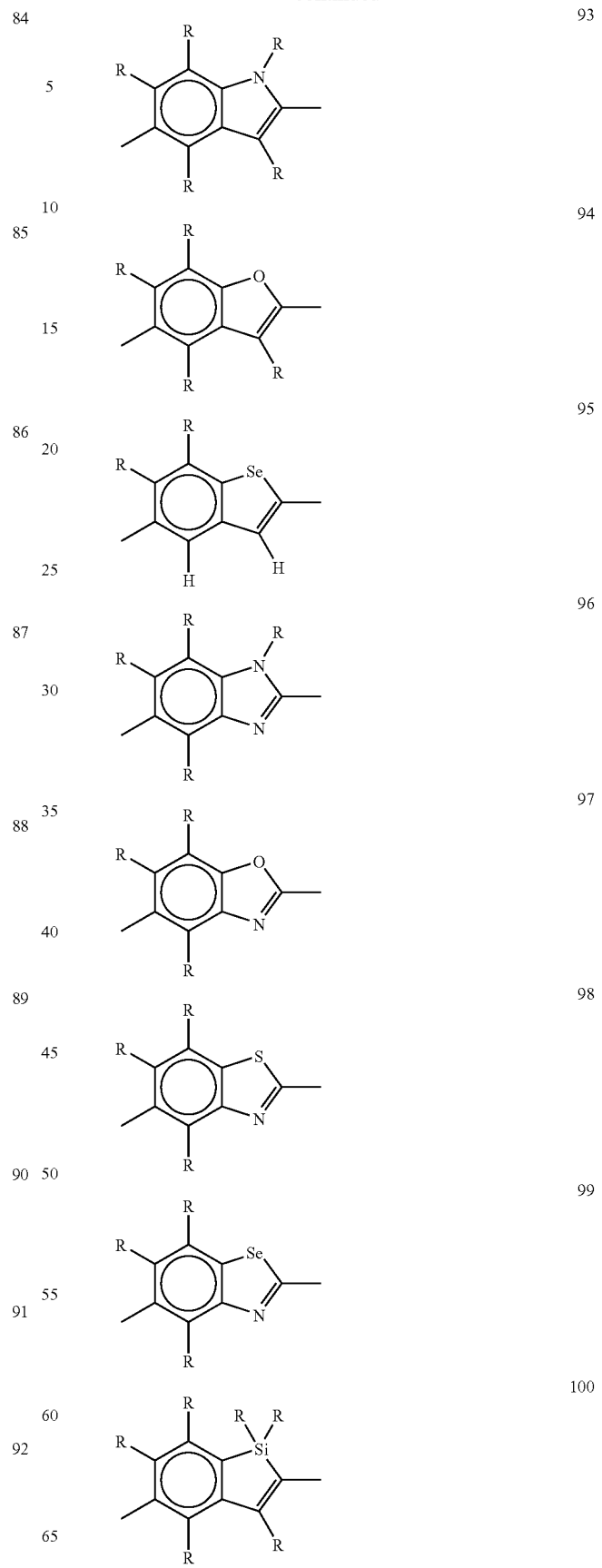

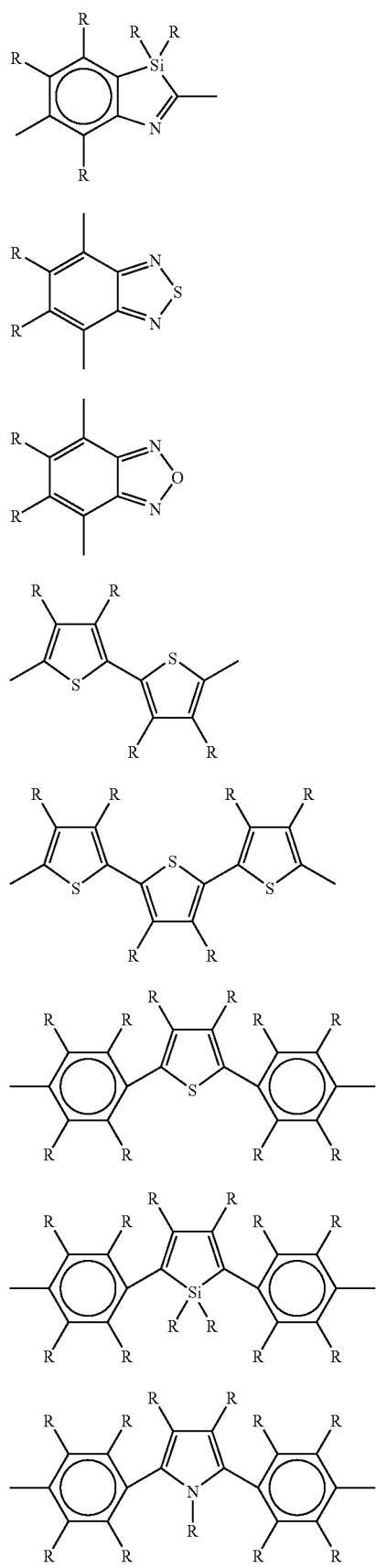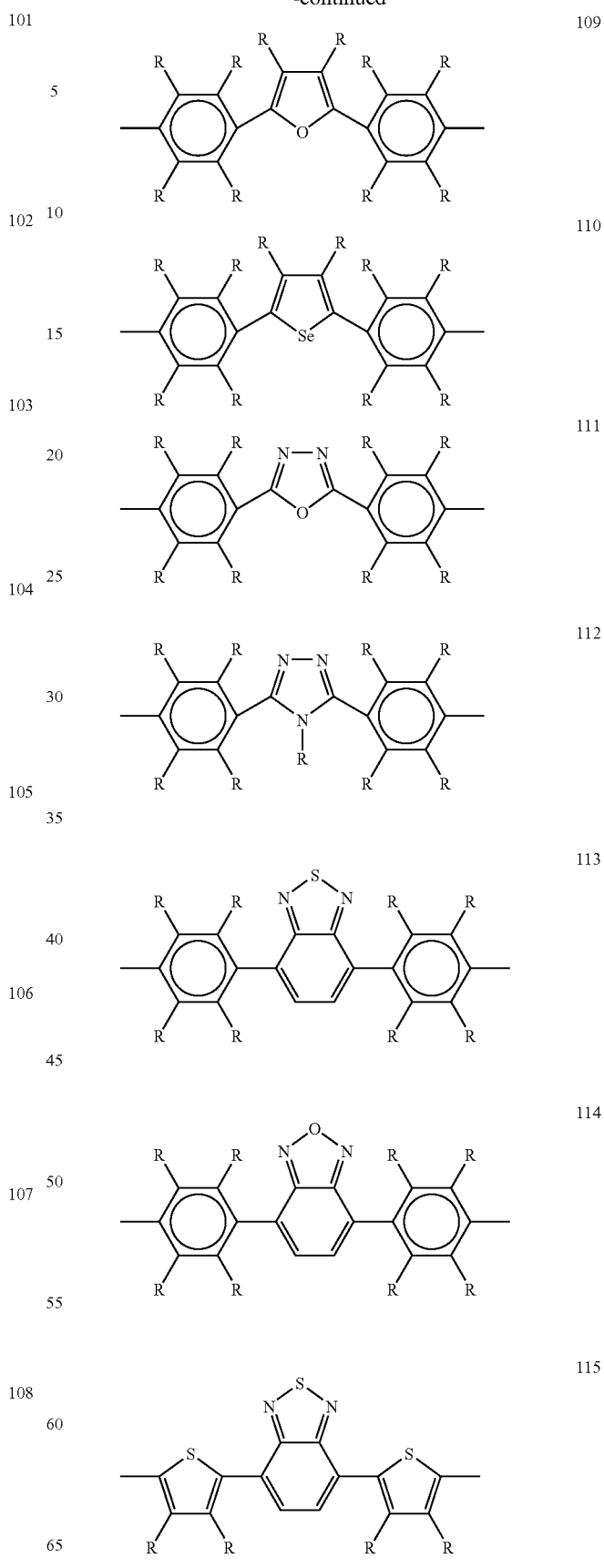

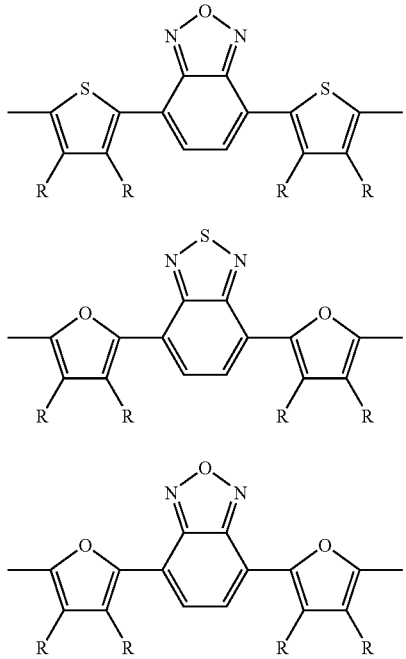

(in the formulae, Rs are independently as defined above).

The divalent aromatic amine group represented by $Ar^1$ includes atomic groups obtained by removing two hydrogen atoms from an aromatic ring of a compound derived from an aromatic tertiary amine. Among the divalent aromatic amine groups, preferable are groups of the following formula (5):

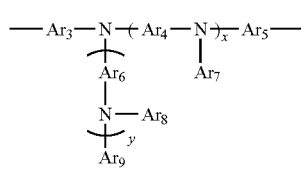

(5)

(wherein, $Ar_3$, $Ar_4$, $Ar_5$ and $Ar_6$ represent each independently an arylene group or divalent heterocyclic group. $Ar_7$, $Ar_8$ and $Ar_9$ represent each independently an aryl group or monovalent heterocyclic group. $Ar_3$, $Ar_4$, $Ar_5$, $Ar_6$, $Ar_7$, $Ar_8$ and $Ar_9$ optionally have a substituent. x and y represent each independently 0 or positive integer)

from the standpoint of changing of light emission wavelength, enhancement of light emission efficiency and improvement in heat resistance.

In the above-described formula (5), x represents preferably an integer of 0 to 2, more preferably 0 or 1, from the standpoint of device properties such as life and the like, and easiness of synthesis of a polymer compound. In the above-described formula (5), y represents preferably an integer of 0 to 2, more preferably 0 or 1, from the standpoint of device properties such as life and the like, and easiness of synthesis of a polymer compound.

Specific examples of the group of the above-described formula (5) include those of the following formulae 119 to 127.

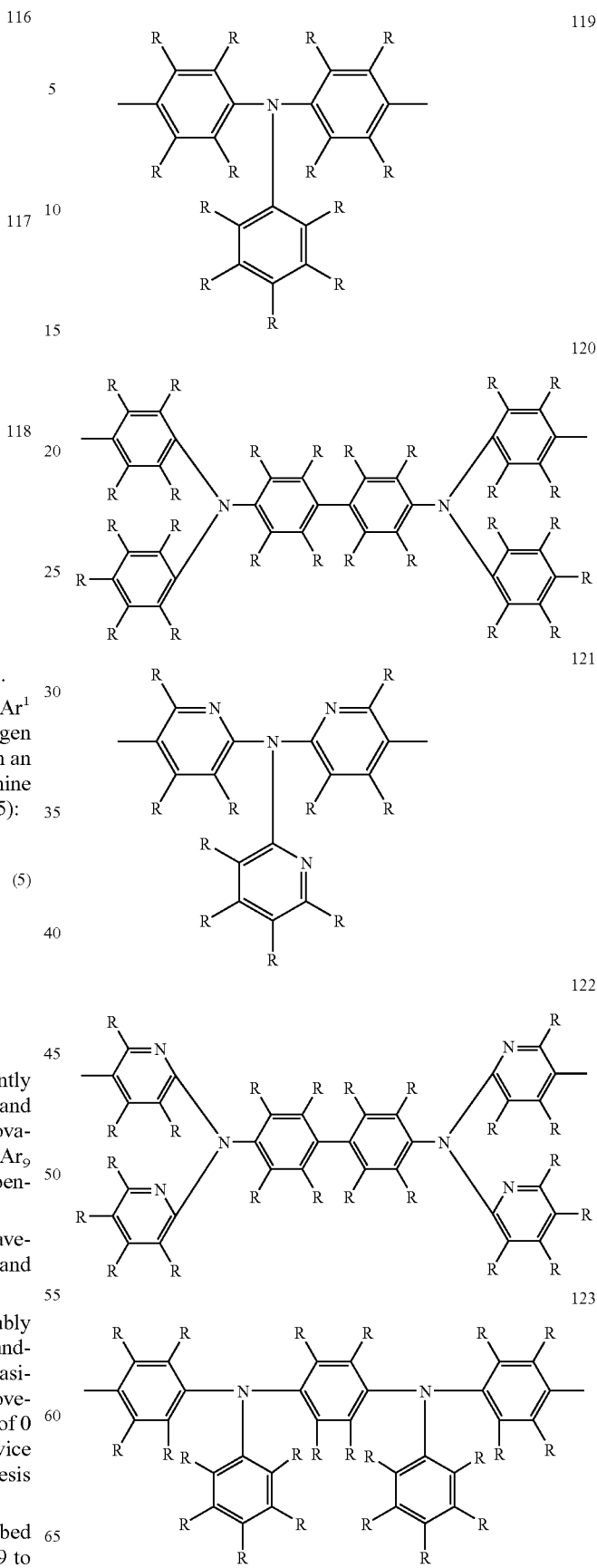

-continued

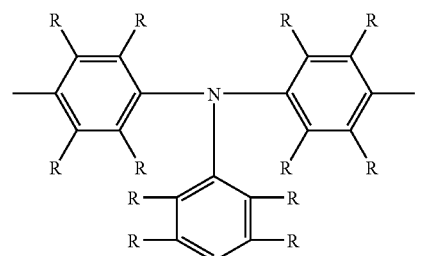
124

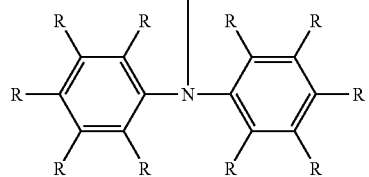
125

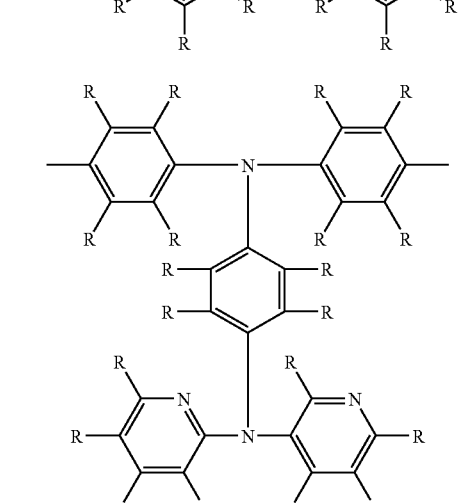
126

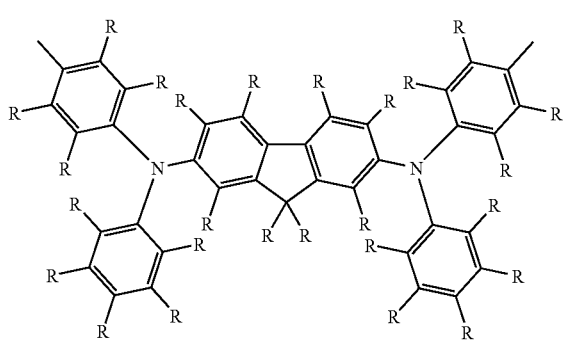
127

(in the formulae, Rs are independently as defined above).

Among the groups $Ar^1$, preferable are repeating units of the following formulae (2-1) to (2-6):

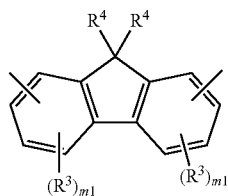
(2-1)

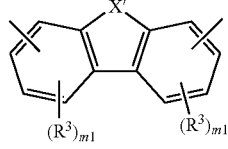
(2-2)

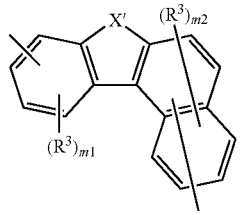
(2-3)

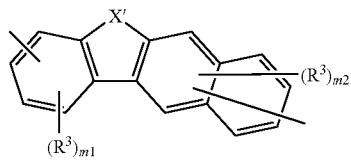
(2-4)

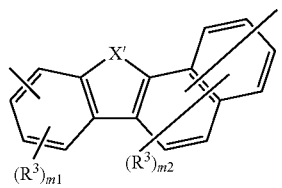
(2-5)

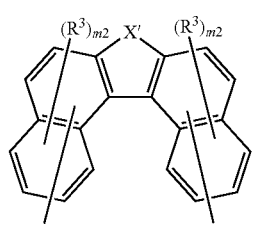
(2-6)

(in the formulae, $R^3$ and $R^4$ represent the same meanings as described above, m1s represent each independently an integer of 0 to 3, and m2s represent each independently an integer of 0 to 5. In the formula (2-2), X' represents —O—, —S—, —S(=O)—, —S(=O)$_2$—, —Si($R^B$)$_2$—Si($R^B$)$_2$—, —Si($R^B$)$_2$—, —B($R^B$)—, —P($R^B$)—, —P(=O)($R^B$)—, —O—C($R^B$)$_2$— or —N=C($R^B$)—, in the formulae (2-3), (2-4), (2-5) and (2-6), X' represents —O—, —S—, —S(=O)—, —S(=O)$_2$—, —C($R^B$)$_2$—, —Si($R^B$)$_2$—Si($R^B$)$_2$—, —Si($R^B$)$_2$—, —B($R^B$)—, —P($R^B$), —P(=O)($R^B$)—, —O—C($R^B$)$_2$—, —C($R^B$)$_2$—O—, —C($R^B$)=N— or —N=C($R^B$)—, and in the formula (2-6), X' represents —O—, —S—, —S(=O)—, —S(=O)$_2$—, —C($R^B$)$_2$—, —Si($R^B$)$_2$—Si($R^B$)$_2$—, —Si($R^B$)$_2$—, —B($R^B$)—, —P($R^B$)—, —P(=O)($R^B$)—, —O—C($R^B$)$_2$— or —N=C($R^B$)—, and $R^B$'s represent each independently a hydrogen atom or substituent) and groups of the above-described formulae 102, 103, 113 to 116 (as repeating units), from the standpoint of device properties such as light emission efficiency and the like.

$R^B$ is preferably a substituent, and the substituent represented by $R^B$ includes alkyl groups, alkoxy groups, alkylthio groups, aryl groups, aryloxy groups, arylthio groups, aryl alkyl groups, aryl alkoxy groups, aryl alkylthio groups, arylalkenyl groups, arylalkynyl groups, amino group, substituted amino groups, silyl group, substituted silyl groups, halogen atoms, acyl group, acyloxy group, imine residues, amide group, acid imide groups, monovalent heterocyclic groups, carboxyl group, substituted carboxyl groups, nitro group, cyano group and the like. A hydrogen atom contained in these groups and residues may be substituted with a fluorine atom. Among the above-described groups $R^B$, preferable, from the standpoint of device properties such as luminance half life and the like, are alkyl groups, alkoxy groups, alkylthio groups, aryl groups, aryloxy groups, arylthio groups, aryl alkyl groups, aryl alkoxy groups and monovalent heterocyclic groups, more preferable are alkyl groups, alkoxy groups, aryl groups and monovalent heterocyclic groups, particularly preferable are alkyl groups and aryl groups. These groups are specifically the same as explained and exemplified as the substituent represented by $R^1$.

The repeating unit contained in a polymer compound of the present invention preferably contains a repeating unit of the above-described formula (1) and a repeating unit of the following formula (3):

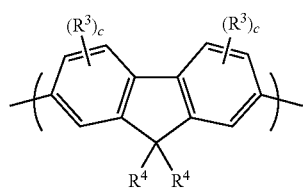

(3)

(wherein, $R^3$ represent a substituent, $R^4$ represents a hydrogen atom or a substituent. c represents an integer of 0 to 3. When there exist a plurality of $R^3$s, these may be the same or different, and two $R^4$s may be the same or different), further preferably contains a repeating unit of the above-described formula (1) and a repeating unit of the above-described formula (3) in which c is 0 and $R^4$ is an alkyl group having 6 to 20 carbon atoms or a repeating unit of the above-described formula (3) in which c is 0 and $R^4$ is an aryl group optionally having a substituent, from the standpoint of device properties.

As the substituent represented by $R^3$, preferable, from the standpoint of solubility of a polymer compound in an organic solvent and easiness of synthesis of a polymer compound, are alkyl groups, alkoxy groups, alkylthio groups, aryl groups, aryloxy groups, arylthio groups, aryl alkyl groups, aryl alkoxy groups and monovalent heterocyclic groups, more preferable are alkyl groups, alkoxy groups, aryl groups and monovalent heterocyclic groups.

As the substituent represented by $R^4$, alkyl groups optionally having a substituent are preferable, and have independently a carbon number of usually 1 to 20, and from the standpoint of device properties and the like, more preferably 6 to 20, further preferably 6 to 8. Specific examples of the alkyl group optionally having a substituent include a methyl group, ethyl group, propyl group, i-propyl group, n-butyl group, i-butyl group, s-butyl group, t-butyl group, pentyl group, isoamyl group, hexyl group, cyclohexyl group, heptyl group, octyl group, 2-ethylhexyl group, nonyl group, decyl group, 3,7-dimethyloctyl group, 1-undecanyl group, 1-dodecanyl group, 1-tridecanyl group, 1-tetradecanyl group, 1-pentadecanyl group, 1-hexadecanyl group and the like, and preferable from the standpoint of device properties and the like are a hexyl group, heptyl group and octyl group.

The substituent represented by $R^4$ may also be an optionally substituted aryl group, preferably an optionally substituted phenyl group. The aryl group has a carbon number of usually about from 6 to 60, preferably 6 to 48. Specific examples of the aryl group include a phenyl group, $C_1$ to $C_{12}$ alkoxyphenyl groups ("$C_1$ to $C_{12}$ alkoxy" means that the carbon number of the alkoxy portion is 1 to 12, being applicable also in the following descriptions), $C_1$ to $C_{12}$ alkylphenyl groups ("$C_1$ to $C_{12}$ alkyl" means that the carbon number of the alkyl portion is 1 to 12, being applicable also in the following descriptions), 1-naphtyl group, 2-naphtyl group, 1-anthracenyl group, 2-anthracenyl group, 9-anthracenyl group, pentafluorophenyl group and the like, and from the standpoint of easiness of synthesis of a polymer compound and the like, optionally substituted phenyl groups are preferable, and from the standpoint of solubility of a polymer compound in an organic solvent and device properties, $C_1$ to $C_{12}$ alkoxyphenyl groups and $C_1$ to $C_{12}$ alkylphenyl groups are preferable. Specific examples of the $C_1$ to $C_{12}$ alkoxyphenyl group include a methoxyphenyl group, ethoxyphenyl group, propyloxyphenyl group, i-propyloxyphenyl group, butoxyphenyl group, i-butoxyphenyl group, t-butoxyphenyl group, pentyloxyphenyl group, hexyloxyphenyl group, cyclohexyloxyphenyl group, heptyloxyphenyl group, octyloxyphenyl group, 2-ethylhexyloxyphenyl group, nonyloxyphenyl group, decyloxyphenyl group, 3,7-dimethyloctyloxyphenyl group, lauryloxyphenyl group and the like. Specific examples of the $C_1$ to $C_{12}$ alkylphenyl group include a methylphenyl group, ethylphenyl group, dimethylphenyl group, propylphenyl group, mesityl group, methylethylphenyl group, i-propylphenyl group, butylphenyl group, i-butylphenyl group, s-butylphenyl group, t-butylphenyl group, pentylphenyl group, isoamylphenyl group, hexylphenyl group, heptylphenyl group, octylphenyl group, nonylphenyl group, decylphenyl group, dodecylphenyl group and the like, and further preferable are a methylphenyl group, ethylphenyl group, hexylphenyl group, heptylphenyl group and octylphenyl group.

All of the ratios of [formula (3):formula (1)], [formula (3):formula (1-1)] and [formula (3):formula (1-2)] are usually 10:90 to 99:1, and from the standpoint of device properties, preferably 30:70 to 98:2, by mol.

The above-described polymer compound may contain two or more repeating units of the above-described formula (1), and may contain two or more repeating units of the above-described formula (3).

The above-described polymer compound may also contain a repeating unit other than the repeating units of the above-described formulae (1) to (3), in a range not deteriorating light emitting property and charge transporting property.

Repeating units in the above-described polymer compound may be connected by a non-conjugated structure, or, the non-conjugated structure may be contained in the repeating units. Examples of this non-conjugated structure include structures shown below, and combinations of two or more of them, and the like.

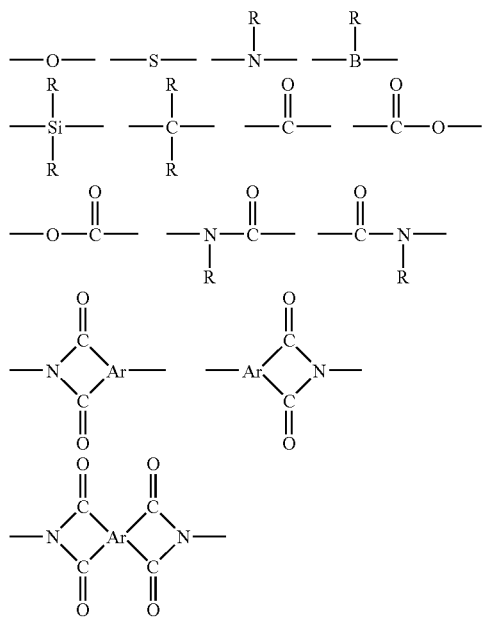

(in the formulae, Rs are independently as defined above, and Ar represents a hydrocarbon group having 6 to 60 carbon atoms which may contain a hetero atom).

Oxygen, sulfur, nitrogen, silicon, boron, phosphorus, selenium and the like are mentioned as the above-described hetero atom, in the above-described formulae.

The above-described polymer compound may be any of a random copolymer, graft copolymer, alternative copolymer and block copolymer. Polymers having an intermediate structure thereof, for example, a random copolymer having a block property may also be permissible. Further, those having branching in the main chain and thus having 3 or more end parts, and dendrimers are also included.

The above-described polymer compound has a polystyrene-reduced number average molecular weight of usually about from $1 \times 10^3$ to $1 \times 10^8$, preferably $1 \times 10^4$ to $1 \times 10^6$. The polystyrene-reduced weight average molecular weight is usually about from $3 \times 10^3$ to $1 \times 10^8$, and from the standpoint of film formability and from the standpoint of light emission efficiency when made into a device, it is preferably $5 \times 10^4$ or more, further preferably $1 \times 10^5$ or more, and from the standpoint of solubility of a polymer compound in an orgnanic solvent, it is preferably $1 \times 10^5$ to $5 \times 10^6$. Even if a polymer compound having a number average molecular weight and a weight average molecular weight in such ranges is used singly to produce a device, and even if two kinds or more of such polymer compounds are used together to produce a device, the resultant device manifests high light emission efficiency. From the standpoint of enhancement of the film formability of a composition of the present invention, the degree of dispersion defined by weight average molecular weight/number average molecular weight is preferably 3 or less.

If a group participating in polymerization (usually, called a polymerization active group) remains as a group situated at the end of the molecular chain of the above-described polymer compound (namely, end group), there is a possibility of decrease in the life and light emitting property when the composition is used in a light emitting device, thus, it is preferable that the end group is protected by a stable group not correlated with polymerization. As this end group, those having a conjugated bond consecutive to the conjugated structure of the main chain of the molecular chain are preferable, and examples include, for example, structures having a bond to an aryl group or heterocyclic group via a carbon-carbon bond. Specific examples include substituents described in chemical formula 10 of JP-A No. 9-45478, and the like.

It is expected to add various properties by capping at least one of the molecular chain ends of the above-described polymer compound with an aromatic end group selected from monovalent heterocyclic groups, monovalent aromatic amine groups, monovalent groups derived from hetero ring coordinated metal complexes, and aryl groups. Specifically, an effect of elongating the time necessary for decrease in the luminance of a device, an effect of enhancing charge injectability, charge transportability, light emitting property and the like, an effect of enhancing the mutual action and solubility between polymer compounds, an anchor-like effect, and the like, are mentioned.

Examples of the method of producing the above-described polymer compound include, for example, a method of polymerization by the Suzuki reaction (Chem. Rev., vol. 95, p. 2457 (1995), a method of polymerization by the Grignard reaction (Kyoritsu Shuppan Co., Ltd., Polymer Functional Material Series vol. 2, Synthesis and Reaction of Polymer (2), p. 432 to 433) a method of polymerization by the Yamamoto Polymerization method (Prog. Polym. Sci., vol. 17, p. 1153 to 1205, 1992), a method of polymerization with an oxidizer such as $FeCl_3$ and the like, a method of performing oxidation polymerization electrochemically (MARUZEN, Experimental Chemical Course 4-th edition, vol. 28, p. 339 to 340), and the like.

When the polymer compound of the present invention is used in a polymer light emitting device and the like, the purity of the polymer compound exerts an influence on the device performances such as light emitting property and the like, thus, it is preferable to purify the monomer before polymerization by a method such as distillation, sublimation purification, re-crystallization and the like, then, to polymerize the monomer. Further, it is preferable, after synthesis, to carry out a purification treatment such as re-precipitation purification, chromatographic fractionation and the like.

From the standpoint of improving film formability and device properties when a film is formed using a polymer compound of the present invention, it may be permissible to mix the polymer compound of the present invention with other low molecular weight organic compound and/or polymer compound to prepare a polymer composition.

The polymer composition of the present invention contains at least one kind of the polymer compound of the present invention, and may also contain a hole transporting material, electron transporting material, light emitting material, stabilizer, antioxidant and the like. These optional components may be used each singly or in combination of two or more.

The low molecular weight organic compound and polymer compound to be combined are not particularly restricted, and those having hole injectability and transportability (hole transporting materials) and having electron injectability and transportability (electron transporting materials) are preferably used.

Specifically, regarding the hole transporting material which may be contained in the polymer composition of the present invention, examples of the low molecular weight organic compound include triphenylamine, tetraphenyldiamine, biscarbazolylbiphenyl and derivatives thereof, and the like, and examples of the polymer compound include polyvinylcarbazole and derivatives thereof, polysilane and derivatives thereof, polysiloxane derivatives having an aromatic amine on the side chain or main chain, pyrazoline derivatives, arylamine derivatives, stilbene derivatives, triphenyldiamine derivatives, polyaniline and derivatives thereof, polythiophene and derivatives thereof, polypyrrole and derivatives thereof, poly(p-phenylenevinylene) and derivatives thereof, poly(2,5-thienylenevinylene) and derivatives thereof, and the like.

Examples of the electron transporting material which may be contained in the polymer composition of the present invention include oxadiazole derivatives, anthraquinodimethane and derivatives thereof, benzoquinone and derivatives thereof, naphthoquinone and derivatives thereof, anthraquinone and derivatives thereof, tetracyanoanthraquinodimethane and derivatives thereof, fluorenone derivatives, diphenyldicyanoethylene and derivatives thereof, diphenoquinone derivatives, metal complexes of 8-hydroxyquinoline and derivatives thereof, polyquinoline and derivatives thereof, polyquinoxaline and derivatives thereof, polyfluorene and derivatives thereof, and the like.

The content ratio of the above-described materials may be determined depending on the use, and when the polymer composition of the present invention contains a hole transporting material, the proportion of the hole transporting material in the composition is usually from 1 wt % to 80 wt %, preferably 5 wt % to 60 wt %. When the composition of the present invention contains an electron transporting material, the proportion of the electron transporting material in the composition is usually from 1 wt % to 80 wt %, preferably 5 wt % to 60 wt %. When the polymer composition of the present invention contains a light emitting material, the proportion of the light emitting material in the composition is usually 1 wt % to 80 wt %.

Examples of the stabilizer which may be contained in the polymer composition of the present invention include phenol antioxidants, phosphorus-based antioxidants and the like.

The polymer compound and polymer composition of the present invention are useful particularly in the form of liquid composition for manufacturing of light emitting devices such as polymer light emitting devices, and organic transistors and solar batteries. The liquid composition is composed of the composition of the present invention containing if necessary a solvent. In this specification, "liquid composition" means a composition which is liquid in device manufacturing, and typically, one which is liquid at normal pressure (namely, 1 atm) and 25° C. The liquid composition is, in general, referred to as ink, ink composition, solution or the like in some cases.

In the case of firm formation using this liquid composition (for example, composition in solution condition) in producing a polymer light emitting device, it may be advantageous to only remove a solvent by drying after application of the liquid composition, and also in the case of mixing of a charge transporting material and a light emitting material, the same means can be applied, that is, this method is extremely advantageous for production. In drying, drying may be effected under heating at about from 50 to 150° C., alternatively, drying may be carried out under reduced pressure of about from $10^{-3}$ Pa.

As the film formation method using a liquid composition, application methods such as a spin coat method, casting method, micro gravure coat method, gravure coat method, bar coat method, roll coat method, wire bar coat method, dip coat method, spray coat method, screen printing method, flexo printing method, offset printing method, inkjet print method and the like can be used.

The proportion of a solvent in the liquid composition is usually from 1 wt % to 99.9 wt %, preferably 60 wt % to 99.9 wt %, further preferably 90 wt % to 99.9 wt % with respect to the total weight of the liquid composition. Though the viscosity of the liquid composition varies depending on a printing method, the viscosity at 25° C. is preferably in a range of from 0.5 to 500 mPa·s, and when a liquid composition passes through a discharge apparatus such as in an inkjet print method and the like, the viscosity at 25° C. is preferably in a range of from 0.5 to 20 mPa·s, for preventing clogging and flying curving in discharging. The proportion of a polymer compound having a repeating unit of the above-described formula (1) or a polymer composition containing one or more of the above-described polymer compounds is usually 20 wt % to 100 wt %, preferably 40 wt % to 100 wt % with respect to the total weight of all components remaining after removal of a solvent from the liquid composition.

As the solvent contained in the liquid composition, those capable of dissolving or dispersing components other than the solvent in the composition are preferable. Examples of the solvent include chlorine-based solvents such as chloroform, methylene chloride, 1,2-dichloroethane, 1,1,2-trichloroethane, chlorobenzene, o-dichlorobenzene and the like, ether solvents such as tetrahydrofuran, dioxane and the like, aromatic hydrocarbon solvents such as toluene, xylene, trimethylbenzene, mesitylene and the like, aliphatic hydrocarbon solvents such as cyclohexane, methylcyclohexane, n-pentane, n-hexane, n-heptane, n-octane, n-nonane, n-decane and the like, ketone solvents such as acetone, methyl ethyl ketone, cyclohexanone and the like, ester solvents such as ethyl acetate, butyl acetate, methyl benzoate, ethylcellosolve acetate and the like, polyhydric alcohols such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin, 1,2-hexane diol and the like and derivatives thereof, alcohol solvents such as methanol, ethanol, propanol, isopropanol, cyclohexanol and the like, sulfoxide solvents such as dimethyl sulfoxide and the like, amide solvents such as N-methyl-2-pyrrolidone, N,N-dimethylformamide, and the like. These solvents may be used singly or in combination of two or more. Among the above-described solvents, one or more organic solvents having a structure containing at least one benzene ring and having a melting point of 0° C. or lower and a boiling point of 100° C. or higher are preferably contained from the standpoint of viscosity, film formability and the like.

Regarding the kind of the solvent, aromatic hydrocarbon solvents, aliphatic hydrocarbon solvents, ester solvents and ketone solvents are preferable from the standpoint of solubility of components other than the solvent in a liquid composition into the organic solvent, uniformity in film formation, viscosity property and the like, and preferable are toluene, xylene, ethylbenzene, diethylbenzene, trimethylbenzene, mesitylene, n-propylbenzene, i-propylbenzene, n-butylbenzene, i-butylbenzene, s-butylbenzene, anisole, ethoxybenzene, 1-methylnaphthalene, cyclohexane, cyclohexanone, cyclohexylbenzene, bicyclohexyl, cyclohexenylcyclohexanone, n-heptylcyclohexane, n-hexylcyclohexane, methylbenzoate, 2-propylcyclohexanone, 2-heptanone, 3-heptanone, 4-heptanone, 2-octanone, 2-nonanone, 2-decanone and dicyclohexyl ketone, and it is more preferable to contain at least one of xylene, anisole, mesitylene, cyclohexylbenzene and bicyclohexylmethyl benzoate.

The number of the solvent to be contained in the liquid composition is preferably 2 or more, more preferably 2 to 3, further preferably 2 from the standpoint of film formability and from the standpoint of device properties and the like.

When two solvents are contained in a liquid composition, one of them may be solid at 25° C. From the standpoint of film formability, it is preferable that one solvent has a boiling point of 180° C. or higher and another solvent has a boiling point of lower than 180° C., and it is more preferable that one solvent has a boiling point of 200° C. or higher and another solvent has a boiling point of lower than 180° C. From the standpoint of viscosity, it is preferable that 0.2 wt % or more of components excepting solvents from a liquid composition are dissolved at 60° C. in solvents, and it is preferable that 0.2 wt % or more of components excepting solvents from a liquid composition are dissolved at 25° C. in one of two solvents.

When three solvents are contained in a liquid composition, one or two of them may be solid at 25° C. From the standpoint of film formability, it is preferable that at least one of three solvents has a boiling point of 180° C. or higher and at least one solvent has a boiling point of 180° C. or lower, and it is more preferable that at least one of three solvents has a boiling point of 200° C. or higher and 300° C. or lower and at least one solvent has a boiling point of 180° C. or lower. From the standpoint of viscosity, it is preferable that 0.2 wt % or more of components excepting solvents from a liquid composition are dissolved at 60° C. in two of three solvents, and it is preferable that 0.2 wt % or more of components excepting solvents from a liquid composition are dissolved at 25° C. in one of three solvents.

When two or more solvents are contained in a liquid composition, the content of a solvent having highest boiling point is preferably from 40 to 90 wt %, more preferably 50 to 90 wt %, further preferably 65 to 85 wt % with respect to the weight of all solvents contained in the liquid composition, from the standpoint of viscosity and film formability.

As the solvent contained in the liquid composition, a combination of anisole and bicyclohexyl, a combination of anisole and cyclohexylbenzene, a combination of xylene and bicyclohexyl, a combination of xylene and cyclohexylbenzene, and a combination of mesitylene and methyl benzoate are preferable from the standpoint of viscosity and film formability.

From the standpoint of solubility of components other than a solvent contained in the liquid composition into the solvent, the difference between the solubility parameter of the solvent and the solubility parameter of the polymer compound contained in the polymer composition of the present invention is preferably 10 or less, more preferably 7 or less. The solubility parameters can be measured by a method described in "Solvent Handbook (published by KODANSHA Co., Ltd., 1976)".

Further, the liquid composition of the present invention may also contain additives for controlling viscosity and/or surface tension, and antioxidants.

As the additives for controlling viscosity and/or surface tension which may be contained in the composition of the present invention, for example, a high molecular weight compound for increasing viscosity (thickening agent), a poor solvent, a low molecular weight compound for decreasing viscosity, a surfactant for lowering surface tension, and the like, may be appropriately combined and used.

As the above-described high molecular weight compound, those not disturbing light emission and charge transportation may be permissible, and when the composition contains a solvent, usually, these are soluble in the solvent. As the high molecular weight compound, for example, polystyrene of high molecular weight, polymethyl methacrylate of high molecular weight, and the like can be used. The above-described high molecular weight compound has a polystyrene reduced number average molecular weight of preferably 500000 or more, more preferably 1000000 or more. Also a poor solvent can be used as a thickening agent. That is, when the composition of the present invention contains a solvent (namely, in the case of liquid composition described later), the viscosity of the composition can be enhanced by adding a small amount of poor solvent to solid components in the composition. In the case of adding a poor solvent for this purpose, the kind of the poor solvent and the addition amount thereof may be advantageously selected in a range not causing deposition of solid components in the composition. When also stability in preservation is taken into consideration, the amount of the poor solvent is preferably 50 wt % or less, more preferably 30 wt % or less with respect to the whole composition.

As the antioxidant which may be contained in the composition of the present invention, those not disturbing light emission and charge transportation may be permissible. Examples of the antioxidant include phenol antioxidants, phosphorus-based antioxidants and the like. By use of the antioxidant, preservation stability of the liquid composition of the present invention can be improved.

Next, the thin film of the present invention will be illustrated.

This thin film can be produced using the above-described polymer compound.

Preferably, a layer containing the above-described polymer compound is formed, and the layer is heated usually at 50° C. or higher to produce a thin film, more preferably, a thin film is produced at a heating temperature of 50° C. or higher and 300° C. or lower, further preferably, a thin film is produced at a heating temperature of 50° C. or higher and 200° C. or lower.

Heating is carried out until the reduction of the thickness of the thin film when a solvent is spin-coated on the thin film reaches preferably 10% or less, more preferably 5% or less.

Since the above-described layer produced by heating is poorly soluble in a solvent, a solution containing a compound and a solvent can be used to easily form a layer containing the compound, on the layer.

When the heating temperature is too low, hardening tends to be insufficient, and when too high, device properties tend to lower in the case of the use of the thin film in an electroluminescence device.

The heating time is usually about from 15 minutes to 1 hour, and as the heating method, methods of heating using an oven and a hot plate are mentioned. Heating can be carried out under an inert gas atmosphere or in vacuo, preferably under a nitrogen atmosphere.

As the kind of the thin film, examples include a luminous thin film, electric conductive thin film and organic semiconductor thin film.

The luminous thin film has a quantum yield of light emission of preferably 50% or more, more preferably 60% or more, further preferably 70% or more from the standpoint of the luminance, light emission voltage and the like of a device.

The electric conductive thin film preferably has a surface resistance of 1 K$\Omega$/□ or less. By doping a thin film with a Lewis acid, ionic compound or the like, electric conductivity can be enhanced. The surface resistance is more preferably 100$\Omega$/□ or less, further preferably 10$\Omega$/□ or less.

In the organic semiconductor thin film, one larger parameter of electron mobility or hole mobility is preferably $10^{-5}$ cm$^2$/V/s or more, more preferably $10^{-3}$ cm$^2$/V/s or more, and further preferably $10^{-1}$ cm$^2$/V/s or more. Using an organic semiconductor thin film, an organic transistor can be manufactures. Specifically, by forming the organic semiconductor thin film on a Si substrate carrying a gate electrode and an insulation film of SiO$_2$ and the like formed thereon, and forming a source electrode and a drain electrode with Au and the like, an organic transistor can be obtained.

Next, the laminate will be illustrated. This laminate means one containing one or more kinds of the above-described thin films and in which the number of layers is 2 or more, and it is preferable that the number of layers is 3 or more. This laminate can be produced using the above-described polymer compound. Preferably, it is produced by a method containing a process of laminating a layer containing the above-described polymer compound and a layer containing an organic compound, and a process of heating the laminate at usually 50° C. or higher. More preferably, the heating temperature is 50° C. or higher and 300° C. or lower, further preferably, the heating temperature is 50° C. or higher and 200° C. or lower. The organic compound may be a low molecular weight compound or a high molecular weight compound, and examples include the above-described hole transporting materials and electron transporting materials.

When the heating temperature is too low, hardening tends to be insufficient, and when too high, device properties tend to lower in the case of the use of the laminate in an electroluminescence device.

The heating time is usually about from 15 minutes to 1 hour, and as the heating method, methods of heating using an oven and a hot plate are mentioned. Heating can be carried out under an inert gas atmosphere or in vacuo, preferably under a nitrogen atmosphere.

The laminate of the present invention can be used in polymer light emitting devices, organic transistors and solar cells.

When the laminate of the present invention is used in a polymer light emitting device, the layer containing the above-described polymer compound can be used as a light emitting layer, electron transporting layer, hole transporting layer, electron injection layer, hole injection layer or the like.

<Application>

Next, application of the polymer compound of the present invention will be illustrated.

The polymer compound of the present invention usually emits fluorescence in solid state and can be used as a polymer light emitter (namely, light emitting material of high molecular weight). The polymer compound of the present invention has an excellent charge transporting ability, and can be suitably used as a polymer light emitting device material or charge transporting material. The polymer light emitting device using this polymer light emitter is a high performance polymer light emitting device which can be driven at low voltage with high light emission efficiency. Therefore, the polymer compound of the present invention is useful as a sheet light source such as a curved light source, flat light source and the like (for example, for illumination and the like); a material of displays such as segment displays (for example, segment type display and the like), dot matrix displays (for example, dot matrix flat display and the like), liquid crystal displays (for example, liquid crystal display, back light for liquid crystal display, and the like) and so on. The polymer compound of the present invention can also be used as a coloring matter for laser, a material for organic solar cell, an organic semiconductor for organic transistor, a material for conductive thin film such as an electric conductive thin film, organic semiconductor thin film and the like, a material for luminous thin film emitting fluorescence, and the like. The organic transistor can also be used as a bi-polar transistor, and can also be used as an electric field effect transistor such as a polymer electric field effect transistor or the like.

<Polymer Light Emitting Device>

Next, the polymer light emitting device of the present invention will be described.

The polymer light emitting device of the present invention is a polymer light emitting device having a layer containing a polymer compound of the present invention between electrodes composed of an anode and a cathode.

Further, it is a polymer light emitting device having a thin layer of the present invention or a laminate of the present invention between electrodes composed of an anode and a cathode.

Further, the polymer light emitting device of the present invention is a polymer light emitting device having a light emitting layer and a charge transporting layer between electrodes composed of an anode and a cathode in which the charge transporting layer is a layer obtained from the polymer compound of the present invention.

Further, the polymer light emitting device of the present invention has a light emitting layer and a charge transporting layer between electrodes composed of an anode and a cathode, and has a charge injection layer between the charge transporting layer and the electrode in which the charge injection layer is a layer obtained from the polymer compound of the present invention.

The above-described layer containing the polymer compound of the present invention may be any of a light emitting layer, hole transporting layer, electron transporting layer and the like, and it is preferable that the organic layer is a light emitting layer.

The light emitting layer is a layer having a function of emitting light. The hole transporting layer is a layer having a function of transporting holes. The electron transporting layer is a layer having a function of transporting electrons. The hole transporting layer and the electron transporting layer are collectively called a charge transporting layer. The light emitting layers, hole transporting layers and electron transporting layers may be each independently used in combination of two or more.

When the polymer light emitting device of the present invention has a light emitting layer, the thickness of the light emitting layer shows an optimum value varying depending on a material to be used, and may be advantageously regulated so as to give appropriate values of driving voltage and light emission efficiency, and is, for example, 1 nm to 1 μm, preferably 2 nm to 500 nm, further preferably 5 nm to 200 nm.

As the method for forming a light emitting layer, for example, a method of film formation from a liquid composition is mentioned. As the film formation method from a liquid composition, application methods such as a spin coat method, casting method, micro gravure coat method, gravure coat method, bar coat method, roll coat method, wire bar coat method, dip coat method, spray coat method, screen printing method, flexo printing method, offset printing method, inkjet printing method and the like can be used. Printing methods such as a screen printing method, flexo printing method, offset printing method, inkjet printing method and the like are preferable since pattern formation and multicolor separate painting are easier.

The polymer light emitting device of the present invention manifests a maximum outer quantum yield of preferably 1% or more, more preferably 1.5% or more when voltage is applied between an anode and a cathode, from the standpoint of device luminance and the like.

Examples of the polymer light emitting device of the present invention include a polymer light emitting device having an electron transporting layer between a cathode and a light emitting layer, a polymer light emitting device having a hole transporting layer between an anode and a light emitting layer, a polymer light emitting device having an electron transporting layer between a cathode and a light emitting layer, and having a hole transporting layer between an anode and a light emitting layer.

Specific examples of the polymer light emitting device of the present invention include the following structures a) to d).
 a) anode/light emitting layer/cathode
 b) anode/hole transporting layer/light emitting layer/cathode
 c) anode/light emitting layer/electron transporting layer/cathode
 d) anode/hole transporting layer/light emitting layer/electron transporting layer/cathode (wherein, / means adjacent lamination of layers, applicable also in the followings)

When the polymer compound of the present invention is used in a hole transporting layer, it is preferable that the polymer compound of the present invention containing a repeating unit of the above-described formula (1) has the hole transporting group. Specific examples the polymer compound containing the hole transporting group include polymers containing an aromatic amine, polymers containing stilbene, and the like.

When the polymer compound of the present invention is used in an electron transporting layer, it is preferable that the polymer compound of the present invention containing a repeating unit of the above-described formula (1) has the electron transporting group. Specific examples of the polymer compound containing the electron transporting group include polymers containing oxadiazole, polymers containing triazole, polymers containing quinoline, polymers containing quinoxaline, polymers containing benzothiazole, and the like.

When the polymer light emitting device of the present invention has a hole transporting layer, hole transporting materials (including those of low molecular weight and those of high molecular weight) are usually used in the hole transporting layer. As this hole transporting material, mentioned are those exemplified for the hole transporting material which may be contained in the composition of the present invention described above.

Specific examples of the hole transporting material, include those described in JP-A Nos. 63-70257, 63-175860, 2-135359, 2-135361, 2-209988, 3-37992 and 3-152184, and the like.

Among them, preferable as the hole transporting material used in a hole transporting layer are high molecular weight hole transporting materials such as polyvinylcarbazole and its derivatives, polysilane and its derivatives, polysiloxane derivatives having an aromatic amine compound group on the side chain or main chain, polyaniline and its derivatives, polythiophene and its derivatives, poly(p-phenylenevinylene) and its derivatives, poly(2,5-thienylenevinylene) and its derivatives, and the like, and further preferable are polyvinylcarbazole and its derivatives, polsilane and its derivatives, and polysiloxane derivatives having an aromatic amine on the side chain or main chain.

Examples of the hole transporting material of low molecular weight are pyrazoline derivatives, arylamine derivatives, stilbene derivatives and triphenyldiamine derivatives. In the case of the hole transporting material of low molecular weight, it is preferably dispersed in a polymer binder in use.

The polymer binder is preferably one which does not extremely disturb charge transportation, and those showing not strong absorption against visible ray are suitably used. Examples of the polymer binder are poly(N-vinylcarbazole), polyaniline and its derivatives, polythiophene and its derivatives, poly(p-phenylenevinylene) and its derivatives, poly(2,5-thienylenevinylene) and its derivatives, polycarbonate, polyacrylate, polymethyl acrylate, polymethyl methacrylate, polystyrene, polyvinyl chloride, polysiloxane and the like.

Polyvinylcarbazole and its derivatives can be obtained, for example, from a vinyl monomer by cation polymerization or radical polymerization.

Examples of the polysilane and its derivatives include compounds described in Chem. Rev., vol. 89, p. 1359 (1989), GB Patent No. 2300196 publication, and the like. Also as the synthesis method, methods described in them can be used, and particularly, the Kipping method is suitably used.

In the polysiloxane and its derivatives, the siloxane skeleton structure shows little hole transportability, thus, those having a structure of the above-described hole transporting material of low molecular weight on the side chain or main chain are suitably used Particularly, examples include those having a hole transporting aromatic amine on the side chain or main chain The film formation method of a hole transporting layer is not particularly restricted, and in the case of a hole transporting material of low molecular weight, examples include a method of film formation from a mixed solution with a polymer binder. In the case of a hole transporting material of high molecular weight, examples include a method of film formation from a solution (that is, mixture of hole transporting material with solvent).

As the solvent used for film formation from a solution, those which can dissolve or uniformly disperse a hole transporting material are preferable. Examples of the solvent include chlorine-based solvents such as chloroform, methylene chloride, 1,2-dichloroethane, 1,1,2-trichloroethane, chlorobenzene, o-dichlorobenzene and the like, ether solvents such as tetrahydrofuran, dioxane and the like, aromatic hydrocarbon solvents such as toluene, xylene and the like, aliphatic hydrocarbon solvents such as cyclohexane, methylcyclohexane, n-pentane, n-hexane, n-heptane, n-octane, n-nonane, n-decane and the like, ketone solvents such as acetone, methyl ethyl ketone, cyclohexanone and the like, ester solvents such as ethyl acetate, butyl acetate, ethylcellosolve acetate and the like, polyhydric alcohols such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin, 1,2-hexanediol and the like and derivatives thereof, alcohol solvents such as methanol, ethanol propanol, propanol, isopropanol, cyclohexanol and the like, sulfoxide solvents such as dimethyl sulfoxide and the like, amide solvents such as N-methyl-2-pyrrolidone, N,N-dimethylformamide and the like. These organic solvents may be used singly or in combination of two or more.

As the method for film formation from a solution, there can be used application methods from a solution such as a spin coat method, casting method, micro gravure coat method, gravure coat method, bar coat method, roll coat method, wire bar coat method, dip coat method, spray coat method, screen printing method, flexo printing method, offset printing method, inkjet printing method and the like.

Regarding the thickness of a hole transporting layer, the optimum value varies depending on a material used, and it may be advantageously selected so that the driving voltage and light emission efficiency show suitable values, and a thickness at least causing no formation of pin holes is necessary, and when the thickness is too large, the driving voltage of a device increases undesirably. Therefore, the thickness of the hole transporting layer is usually 1 nm to 1 μm, preferably 2 nm to 500 nm, further preferably 5 nm to 200 nm.

When the polymer light emitting device of the present invention has an electron transporting layer, electron transporting materials (including those of low molecular weight and those of high molecular weight) are usually used in the electron transporting layer. As this electron transporting material, mentioned are those exemplified for the electron transporting material which may be contained in the composition of the present invention described above.

Specific examples of the electron transporting material include those described in JP-A Nos. 63-70257, 63-175860, 2-135359, 2-135361, 2-209988, 3-37992 and 3-152184, and the like.

Of them, oxadiazole derivatives, benzoquinone and its derivatives, anthraquinone and its derivatives, metal complexes of 8-hydroxyquinoline and its derivatives, polyquinoline and its derivatives, polyquinoxaline and its derivatives, polyfluorene and its derivatives are preferable, and 2-(4-biphenylyl)-5-(4-t-butylphenyl)-1,3,4-oxadiazole, benzoquinone, anthraquinone, tris(8-quinolinol)aluminum and polyquinoline are further preferable.

The film formation method of an electron transporting layer is not particularly restricted, and in the case of an electron transporting material of low molecular weight, examples include a vacuum vapor-deposition method from powder, film formation methods from solution or melted conditions, and in the case of an electron transporting material of high molecular weight, examples include film formation methods from solution or melted condition, respectively. In film formation from solution or melted condition, the above-described polymer binder may be used together.

As the solvent used for film formation from a solution, compounds which can dissolve or uniformly disperse an electron transporting material and/or polymer binder are preferable. Specifically mentioned are those exemplified as the solvent to be used for film formation of a hole transporting layer from a solution in the column of the above-described hole transporting layer. The solvents may be used singly or in combination of two or more.

As the film formation method from solution or melted condition, mentioned are those exemplified as the film formation method of a hole transporting layer from a solution in the column of the above-described hole transporting layer.

Regarding the thickness of an electron transporting layer, the optimum value varies depending on a material to be used, and it may be advantageously selected so that the driving voltage and light emission efficiency show suitable values, and a thickness at least causing no formation of pin holes is necessary, and when the thickness is too large, the driving voltage of a device increases undesirably. Therefore, the thickness of the electron transporting layer is usually 1 nm to 1 μm, preferably 2 nm to 500 nm, further preferably 5 nm to 200 nm.

Among hole transporting layers and electron transporting layers provided next to an electrode, those having a function of improving charge injecting efficiency from an electrode and having an effect of lowering the driving voltage of a device are, in particular, called generally a hole injection layer and an electron injection layer, respectively (hereinafter, these are collectively called "charge injection-layer" in some cases).

Further, for improving close adherence with an electrode or improving charge injection from an electron, the above-described charge injection layer or an insulation layer may be provided next to the electrode, alternatively, for improving close adherence of an interface or preventing mixing, a thin buffer layer may be inserted into an interface of a charge transporting layer and a light emitting layer.

The order and number of layers to be laminated, and thickness of each layer can be appropriately determined in view of light emission efficiency and device life.

In the present invention, examples of the polymer light emitting device carrying a charge injection layer include polymer light emitting devices having a charge injection layer provided next to a cathode and polymer light emitting devices having a charge injection layer next to an anode. Specifically, the following structures e) to p) are mentioned.

e) anode/hole injection layer/light emitting layer/cathode f) anode/light emitting layer/electron injection layer/cathode g) anode/hole injection layer/light emitting layer/electron injection layer/cathode h) anode/hole injection layer/hole transporting layer/light emitting layer/cathode i) anode/hole injection layer/light emitting layer/electron injection layer/cathode j) anode/hole injection layer/hole transporting layer/light emitting layer/electron injection layer/cathode k) anode/hole injection layer/light emitting layer/electron transporting layer/cathode l) anode/light emitting layer/electron transporting layer/electron injection layer/cathode m) anode/hole injection layer/light emitting layer/electron transporting layer/electron injection layer/cathode n) anode/hole injection layer/hole transporting layer/light emitting layer/electron transporting layer/cathode o) anode/hole transporting layer/light emitting layer/electron transporting layer/electron injection layer/cathode p) anode/hole injection layer/hole transporting layer/light emitting layer/electron transporting layer/electron injection layer/cathode The polymer light emitting device of the present invention includes also those in which a polymer compound of the present invention is contained in a hole transporting layer and/or electron transporting layer, as described above. The polymer light emitting device of the present invention includes also those in which a polymer compound of the present invention is contained in a hole injection layer and/or electron injection layer.

When the polymer compound of the present invention is used in a hole injection layer, it is preferable that the compound is used simultaneously with an electron receptive compound. When the polymer compound of the present invention is used in an electron transporting layer, it is preferable that the compound is used simultaneously with an electron donating compound. Here, for simultaneous use, there are methods such as copolymerization, introduction as a side chain, and the like.

Specific examples of the charge injection layer include a layer containing an electric conductive polymer, a layer provided between an anode and a hole transporting layer and containing a material having ionization potential of a value between an anode material and a hole transporting material contained in a hole transporting layer, a layer provided between a cathode and an electron transporting layer and containing a material having electron affinity of a value between a cathode material and an electron transporting material contained in an electron transporting layer, and the like.

When the charge injection layer contains an electric conductive polymer, the electric conductivity of the electric conductive polymer is preferably $10^{-5}$ S/cm or more and $10^{3}$ or less, and for decreasing leak current between light emission picture elements, more preferably $10^{-5}$ S/cm or more and $10^{2}$ or less, further preferably $10^{-5}$ S/cm or more and $10^{1}$ or less. Usually, for controlling the electric conductivity of the electric conductive polymer to $10^{-5}$ S/cm or more and $10^3$ or less, the electric conductive polymer is doped with a suitable amount of electrons.

As the kind of ions to be doped, an anion is used in a hole injection layer and a cation is used in an electron injection layer. Examples of the anion include a polystyrenesulfonic ion, alkylbenzenesulfonic ion, camphorsulfonic ion and the like. Examples of the cation include a lithium ion, sodium ion, potassium ion, tetrabutylammonium ion and the like.

The thickness of the charge injection layer is usually from 1 nm to 100 nm, preferably 2 nm to 50 nm.

The material used in the charge injection layer may be appropriately selected depending on a relation with the material of an electrode and an adjacent layer, and examples include polyaniline and its derivatives, polythiophene and its derivatives, polypyrrole and its derivatives, polyphenylenevinylene and its derivatives, polythienylenevinylene and its derivatives, polyquinoline and its derivatives, polyquinoxaline and its derivatives, electric conductive polymers such as polymers containing an aromatic amine structure on the side chain or main chain, metal phthalocyanine (copper phthalocyanine and the like), carbon and the like.

The insulation layer usually has a thickness of from 0.5 to 4.0 nm, and has a function of rendering charge injection easier. The material of the insulation layer includes metal fluorides, metal oxides, organic insulation materials and the like.

The polymer light emitting device carrying an insulation layer includes a polymer light emitting device in which an insulation layer is provided next to a cathode, and a polymer light emitting device in which an insulation layer is provided next to an anode. Specifically, the following structures q) to ab) are mentioned, for example.

q) anode/insulation layer/light emitting layer/cathode
r) anode/light emitting layer/insulation layer/cathode
s) anode/insulation layer/light emitting layer/insulation layer/cathode
t) anode/insulation layer/hole transporting layer/light emitting layer/cathode
u) anode/hole transporting layer/light emitting layer/insulation layer/cathode
v) anode/insulation layer/hole transporting layer/light emitting layer/insulation layer/cathode
w) anode/insulation layer/light emitting layer/electron transporting layer/cathode
x) anode/light emitting layer/electron transporting layer/insulation layer/cathode
y) anode/insulation layer/light emitting layer/electron transporting layer/insulation layer/cathode
z) anode/insulation layer/hole transporting layer/light emitting layer/electron transporting layer/cathode
aa) anode/hole transporting layer/light emitting layer/electron transporting layer/insulation layer/cathode
ab) anode/insulation layer/hole transporting layer/light emitting layer/electron transporting layer/insulation layer/cathode The polymer light emitting device of the present invention contains a composition of the present invention in any of the hole injection layer, hole transporting layer, light emitting layer, electron transporting layer and electron injection layer, in the above-described device structures a) to ab).

The polymer light emitting device of the present invention is usually formed on a substrate. This substrate may advantageously be one forming an electrode and which does not change in forming a layer of an organic substance. Examples of the material of the substrate include glass, plastic, polymer film, silicon substrate and the like. In the case of an opaque substrate, it is preferable that the opposite electrode (namely, an electrode more remote from the substrate) is transparent or semi-transparent. Usually, at least one of an anode and a cathode contained in a polymer light emitting device of the present invention is transparent or semi-transparent. It is preferable that a cathode side is transparent or semi-transparent.

As the material of the cathode, an electric conductive metal oxide film, semi-transparent metal thin film and the like are used. Specifically, films (NESA and the like) formed using electric conductive glass composed of indium oxide, zinc oxide, tin oxide, and composite thereof: indium.tin.oxide (ITO), indium.zinc.oxide and the like, gold, platinum, silver, copper and the like are used, and ITO, indium.zinc.oxide, tin oxide are preferable. As the manufacturing method, a vacuum vapor-deposition method, sputtering method, ion plating method, plating method and the like are mentioned. As the anode, organic transparent electric conductive films made of polyaniline and its derivative, polythiophene and its derivative, and the like may be used.

The thickness of an anode can be appropriately selected in view of light transmission and electric conductivity, and it is usually 10 nm to 10 μm, preferably 20 nm to 1 μm, further preferably 50 nm to 500 nm.

For making charge injection easier, a layer made of a phthalocyanine derivative, electric conductive polymer, carbon and the like, or a layer made of a metal oxide, metal fluoride, organic insulation material and the like, may be provided on an anode.

As the material of a cathode, materials of small work function are preferable. For example, metals such as lithium, sodium, potassium, rubidium, cesium, beryllium, magnesium, calcium, strontium, barium, aluminum, scandium, vanadium, zinc, yttrium, indium, cerium, samarium, europium, terbium, ytterbium and the like, alloys made of two or more of them, or alloys made of at least one of them and at least one of gold, silver, platinum, copper, manganese, titanium, cobalt, nickel, tungsten and tin, graphite or graphite intercalation compounds and the like are used. Examples of the alloy include magnesium-silver alloy, magnesium-indium alloy, magnesium-aluminum alloy, indium-silver alloy, lithium-aluminum alloy, lithium-magnesium alloy, lithium-indium alloy, calcium-aluminum alloy and the like. The cathode may take a laminated structure including two or more layers.

The thickness of a cathode can be appropriately selected in view of electric conductivity and durability, and it is, for example, 10 nm to 10 μm, preferably 20 nm to 1 μm, further preferably 50 nm to 500 nm.

As the cathode manufacturing method, a vacuum vapor-deposition method, sputtering method, lamination method of thermally press-bonding a metal thin film, and the like are used. A layer made of an electric conductive polymer, or a layer made of a metal oxide, metal fluoride, organic insulation material and the like, may be provided between a cathode and an organic substance layer, and after manufacturing a cathode, a protective layer for protecting the polymer light emitting device may be installed. For use of the polymer light emitting device stably for a long period of time, it is preferable to install a protective layer and/or protective cover, for protecting a device from outside.

As the protective layer, a polymer compound, metal oxide, metal fluoride, metal boride, metal nitride, organic inorganic hybrid material and the like can be used. As the protective cover, a glass plate, and a plastic plate having a surface subjected to low water permeation treatment, and the like can be used, and a method of pasting the cover to a device substrate with a thermosetting resin or photo-curable resin to attain close sealing is suitably used. When a space is maintained using a spacer, prevention of blemishing of a device is easier. If an inert gas such as nitrogen, argon and the like is filled in this space, oxidation of a cathode can be prevented, further, by placing a drying agent such as barium oxide and the like in this space, it becomes easier to suppress moisture adsorbed in a production process from imparting damage to the device. It is preferable to adopt one strategy among these methods.

The polymer light emitting device of the present invention can be used for sheet light sources such as a curved light source, flat light source and the like (for example, for illumination and the like); displays such as segment displays (for example, segment type display and the like), dot matrix displays (for example, dot matrix flat display and the like), liquid crystal displays (for example, liquid crystal display, back light for liquid crystal display, and the like) and so on.

For obtaining light emission in the form of sheet using a polymer light emitting device of the present invention, it may be advantages to place a sheet anode and a sheet cathode so as to overlap. For obtaining light emission in the form of pattern, there are a method in which a mask having a window in the form of pattern is placed on the surface of the sheet light emitting device, a method in which an organic substance layer in non-light emitting parts is formed with extremely large thickness to give substantially no light emission, and a method in which either anode or cathode, or both electrodes are formed in the form pattern. By forming a pattern by any of these methods, and placing several electrodes so that On/Off is independently possible, a display of segment type is obtained which can display digits, letters, simple marks and the like. Further, for providing a dot matrix device, it may be permissible that both an anode and a cathode are formed in the form of stripe, and placed so as to cross. By using a method in which several polymer fluorescent bodies showing different emission colors are painted separately or a method in which a color filter or a fluorescence conversion filter is used, partial color display and multi-color display are made possible. In the case of a dot matrix device, passive driving is also possible, and active driving may also be carried out in combination with TFT and the like. These displays can be used as a display of a computer, television, portable terminal, cellular telephone, car navigation, view finder of video camera, and the like.

The above-described sheet light emitting device is of self emitting and thin type, and can be suitably used as a sheet light source for back light of a liquid crystal display, or as a sheet light source for illumination. If a flexible substrate is used, it can also be used as a curved light source or display.

<Organic Transistor (Polymer Electric Field Effect Transistor)>

Next, a polymer electric field effect transistor as one embodiment of organic transistors will be described.

The polymer compound of the present invention can be suitably used as a material of a polymer electric field effect transistor, particularly, as an active layer. Regarding the structure of a polymer electric field effect transistor, it may be usually advantageous that a source electrode and a drain electrode are placed in contact with an active layer made of a polymer, further, a gate electrode is placed sandwiching an insulation layer in contact with the active layer.

The polymer electric field effect transistor is usually formed on a supporting substrate. The material of the supporting substrate is not particularly restricted providing it does not disturb a property as an electric field effect transistor, and glass substrates and flexible film substrates and plastic substrates can also be used.

The polymer electric field effect transistor can be produced by known methods, for example, a method described in JP-A No. 5-110069.

It is very advantageous and preferable for production to use a composition containing a polymer soluble in an organic solvent, in forming an active layer. As the method of film formation from a liquid composition composed of an organic solvent-soluble polymer compound containing a solvent, methods such as a spin coat method, casting method, micro gravure coat method, gravure coat method, bar coat method, roll coat method, wire bar coat method, dip coat method, spray coat method, screen printing method, flexo printing method, offset printing method, inkjet printing method and the like can be used.

Preferable is an encapsulated polymer electric field effect transistor obtained by manufacturing a polymer electric field effect transistor, then, encapsulating this. By this, the polymer electric field effect transistor is blocked from atmospheric air, thereby, lowering of properties of the polymer electric field effect transistor can be suppressed.

As the encapsulation method, a method of covering with an ultraviolet (UV) hardening resin, thermosetting resin, or inorganic SiONx film and the like, a method of pasting a glass plate or film with an UV hardening resin, thermosetting resin or the like, and other methods are mentioned. For effectively performing blocking from atmospheric air, it is preferable that processes after manufacturing of a polymer electric field effect transistor until encapsulation are carried out without exposing to atmospheric air (for example, in dried nitrogen atmosphere, vacuum and the like).

The polymer compound of the present invention can be produced by a method of polymerization using a compound of the following formula (4) as a raw material.

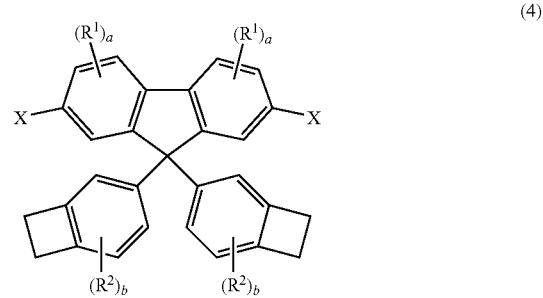

(4)

In the formula, Xs represent a substituent that can participate in polymerization. $R^1$, $R^2$ and a, b represent independently the same meanings as described above.

The substituent that can participate in polymerization include halogen atoms, alkyl sulfonate groups, aryl sulfonate groups, aryl alkyl sulfonate groups, borate groups, sulfoniummethyl groups, phosphoniummethyl groups, phosphonate methyl groups, methyl monohalide groups, magnesium halide groups, stannyl group, —$B(OH)_2$, formyl group, cyano group, vinyl group and the like.

Of them, preferable are —$B(OH)_2$, borate groups, magnesium halides, stannyl group, halogen atoms, alkyl sulfonate groups, aryl sulfonate groups and aryl alkyl sulfonate groups.

Here, mentioned as the halogen atom are a fluorine atom, chlorine atom, bromine atom and iodine atom, and preferable are a chlorine atom, bromine atom and iodine atom. A bromine atom is further preferable.

Examples of the alkyl sulfonate group include a methane sulfonate group, ethane sulfonate group, trifluoromethane sulfonate group and the like, as the aryl sulfonate group, a benzene sulfonate group, p-toluene sulfonate group and the like, and examples of the aryl alkyl sulfonate group include a benzyl sulfonate group and the like.

The borate group includes dialkyl esters, diaryl esters and diaryl alkyl esters, and examples include groups of the following formulae.

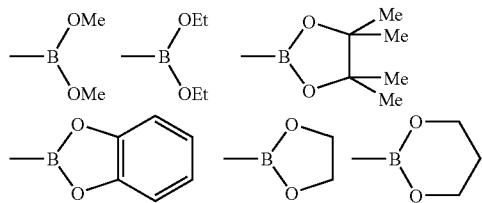

Examples of the sulfoniummethyl group include groups of the following formulae.

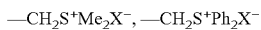

(wherein, X represents a halogen atom and Ph represents a phenyl group.)

Examples of the phosphoniummethyl group include groups of the following formula.

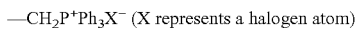

Examples of the phosphonate methyl group include groups of the following formula.

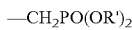

(X represents a halogen atom, R' represents an alkyl group, aryl group or arylalkyl group.)

Examples of the methyl monohalide group include a methyl fluoride group, methyl chloride group, methyl bromide group and methyl iodide group.

Examples of the magnesium halide group include a magnesium chloride group, magnesium bromide group and magnesium iodide group.

The stannyl group represents a stannyl group having three substituents selected from a hydrogen atom, halogen atoms, alkyl groups, aryl groups and arylalkyl groups, and examples include a stannyl group, trichlorostannyl group, trimethylstannyl group, triethylstannyl group, tri-n-butylstannyl group, triphenylstannyl group and tribenzylstannyl group.

A preferable substituent as the substituent correlable with polymerization differs depending on the kind of the polymerization reaction, and in the case of use of a 0-valent nickel complex such as, for example, the Yamamoto coupling reaction and the like, mentioned are halogen atoms, alkyl sulfonate groups, aryl sulfonate groups or aryl alkyl sulfonate groups. In the case of use of a nickel catalyst or palladium catalyst such as the Suzuki coupling reaction and the like, mentioned are alkyl sulfonate groups, halogen atoms, borate groups, —B(OH)$_2$ and the like.

The production method of the present invention can be carried out, specifically, by dissolving a compound having a plurality of substituents correlated with polymerization, as a monomer, in an organic solvent if necessary, using, for example, an alkali and a suitable catalyst, at temperatures of not lower than the melting point and not higher than the boiling point of the organic solvent. For example, known methods can be used described in "Organic Reactions", vol. 14, p. 270 to 490, John Wiley & Sons, Inc., 1965, "Organic Syntheses", Collective Volume VI, p. 407 to 411, John Wiley & Sons, Inc., 1988, Chem. Rev., vol. 95, p. 2457 (1995), J. Organomet. Chem., vol. 576, p. 147 (1999), Makromol. Chem., Macromol. Symp., vol. 12, p. 229 (1987), and the like.

In the method of producing a polymer compound of the present invention, production can be performed by using a known condensation reaction, depending on the substituent correlable with polymerization of a compound of the above-described formula (4), as the method for polymerization.

By carrying out polymerization in the coexistence of a compound having two or more substituents correlable with polymerization, a copolymer can be produced. By copolymerizing a compound having three or more substituents correlable with polymerization, a polymer compound having a branched structure can be produced.

When the polymer compound of the present invention generates a double bond in polymerization, for example, a method described in JP-A No. 5-202355 is mentioned. Namely, examples include polymerization by the Wittig reaction of a compound having a formyl group and a compound having a phosphoniummethyl group, or of a compound having a formyl group and a phosphoniummethyl group, polymerization by the Heck reaction of a compound having a vinyl group and a compound having a halogen atom, polycondensation by a dehydrohalogenation method of a compound having two or more methyl monohalide groups, polycondensation by a sulfonium salt decomposition method of a compound having two or more methylsulfonium groups, polymerization by the Knoevenagel reaction of a compound having a formyl group and a compound having a cyano group, polymerization by the McMurry reaction of compound having two or more formyl groups, and the like.

When the polymer compound of the present invention generates a triple bond in the main chain by condensation polymerization, for example, the Heck reaction and the Sonogashira reaction can be utilized.

In the case of no generation of double bond or triple bond, examples include, for example, a method of polymerization by the Suzuki coupling reaction from the corresponding monomer, a method of polymerization by the Grignard method, a method of polymerization by a Ni(0) complex, a method of polymerization by an oxidizer such as FeCl$_3$ and the like, a method of electrochemical oxidation polymerization, a method by decomposition of an intermediate polymer having a suitable leaving group, and the like.

Of them, polymerization by the Wittig reaction, polymerization by the Heck reaction, polymerization by the Knoevenagel reaction, method of polymerization by the Suzuki coupling reaction, method of polymerization by the Grignard reaction and method of polymerization by a nickel 0-valent complex are preferable from the standpoint of easiness of control of the molecular weight and from the standpoint of easiness of control of composition ratio in the case of copolymerization.

In the production method of the present invention, it is preferable that the substituents correlable with polymerization are selected independently from halogen atoms, alkyl sulfonate groups, aryl sulfonate groups and aryl alkyl sulfonate groups, and condensation polymerization is carried out in the present of a nickel 0-valent complex or palladium catalyst.

The raw material compound includes dihalogenated compounds, bis(alkyl sulfonate) compounds, bis(aryl sulfonate) compounds, bis(aryl alkyl sulfonate) compounds or halogen-alkyl sulfonate compounds, halogen-aryl sulfonate compounds, halogen-aryl alkyl sulfonate compounds, alkyl sulfonate-aryl sulfonate compounds, alkyl sulfonate-aryl alkyl sulfonate compounds, and aryl sulfonate-aryl alkyl sulfonate compounds.

In this case, there is mentioned a method in which a polymer compound in which the orientation of a repeating unit and a sequence are controlled is produced by using, for example, a halogen-alkyl sulfonate compound, halogen-aryl sulfonate compound, halogen-aryl alkyl sulfonate compound, alkyl sulfonate-aryl sulfonate compound, alkyl sulfonate-aryl alkyl sulfonate compound, and aryl sulfonate-aryl alkyl sulfonate compound as the raw material compound.

Among the production methods of the present invention, preferable is a production method in which the substituents correlable with polymerization are selected independently from halogen atoms, alkyl sulfonate groups, aryl sulfonate groups, aryl alkyl sulfonate groups, —B(OH)$_2$ or borate group, and the ratio of the sum (J) of mol numbers of halogen atoms, alkyl sulfonate groups, aryl sulfonate groups and aryl alkyl sulfonate groups to the sum (K) of mol numbers of —B(OH)$_2$ and borate groups, in all raw material compounds, is substantially 1 (usually, K/J is in a range of 0.7 to 1.2), and condensation polymerization is carried out using a nickel catalyst or palladium catalyst.

As specific combinations of raw material compounds, there are mentioned combinations of a dihalogenated compound, bis(alkyl sulfonate) compound, bis(aryl sulfonate) compound or bis(aryl alkyl sulfonate) compound with a diboric acid compound or diborate compound.

Further mentioned are a halogen-boric acid compound, halogen-borate compound, alkyl sulfonate-boric acid compound, alkyl sulfonate-borate compound, aryl sulfonate-boric acid compound, aryl sulfonate-borate compound, aryl alkyl sulfonate-boric acid compound, aryl alkyl sulfonate-boric acid compound and aryl alkyl sulfonate-borate compound.

In this case, there is mentioned a method in which a polymer compound in which the orientation of a repeating unit and a sequence are controlled is produced by using, for example, a halogen-boric acid compound, halogen-borate compound, alkyl sulfonate-boric acid compound, alkyl sulfonate-borate compound, aryl sulfonate-boric acid compound, aryl sulfonate-borate compound, aryl alkyl sulfonate-boric acid compound, aryl alkyl sulfonate-boric acid compound or aryl alkyl sulfonate-borate compound as the raw material compound.

The organic solvent differs depending on the reaction and compound to be used, and for suppressing a side reaction, in general, it is preferable that the solvent to be used is subjected to a sufficient deoxygenation treatment and the reaction is progressed in an inert atmosphere. Further, it is preferable to perform a dehydration treatment likewise. However, this is not the case when a reaction in a two-phase system with water such as in the Suzuki coupling reaction is carried out.

Examples of the solvent include saturated hydrocarbons such as pentane, hexane, heptane, octane, cyclohexane and the like, unsaturated hydrocarbons such as benzene, toluene, ethylbenzene, xylene and the like, halogenated saturated hydrocarbons such as carbon tetrachloride, chloroform, dichloromethane, chlorobutane, bromobutane, chloropentane, bromopentane, chlorohexane, bromohexane, chlorocyclohexane, bromocyclohexane and the like, halogenated unsaturated hydrocarbons such as chlorobenzene, dichlorobenzene, trichlorobenzene and the like, alcohols such as methanol, ethanol, propanol, isopropanol, butanol, t-butyl alcohol and the like, carboxylic acids such as formic acid, acetic acid, propionic acid and the like, ethers such as dimethyl ether, diethyl ether, methyl-t-butyl ether, tetrahydrofuran, tetrahydropyran, dioxane and the like, amines such as trimethylamine, triethylamine, N,N,N',N'-tetramethylethylenediamine, pyridine and the like, amides such as N,N-dimethylformamide, N,N-dimethylacetamide, N,N-diethylacetamide, N-methylmorpholine oxide, and the like, and single solvents or mixed solvents thereof may also be used.

For reacting, an alkali or suitable catalyst is appropriately added. These may be advantageously selected depending on the reaction to be used. As the alkali or catalyst, those which are sufficiently dissolved in the solvent used in the reaction are preferable. Examples of the method of mixing an alkali or catalyst include a method in which a solution of an alkali or catalyst is added slowly while stirring the reaction liquid under an inert atmosphere such as argon and nitrogen and the like, or reversely, the reaction liquid is slowly added to a solution of an alkali or catalyst.

A compound of the above-described formula (4) of the present invention can be produced from a compound of the following formula (6).

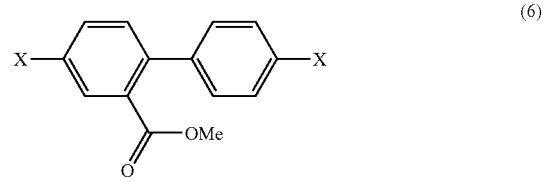

(6)

In the formulae, X represents the same meaning as described above.

When a compound of the above-described formula (6) and 3-bromobenzocyclobutene are dissolved in a solvent and reacted at −78° C. in the presence of alkyllithium or alkylmagnesium, a compound of the following formula (7) is produced. As the solvent, aromatic hydrocarbon solvents such as toluene and the like or ether solvents such as tetrahydrofuran and the like are used.

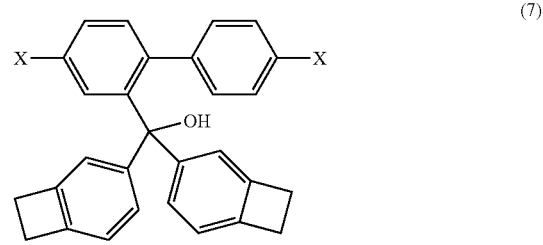

(7)

In the formulae, X represents the same meaning as described above.

When a compound of the above-described formula (7) is dissolved in a solvent and reacted at 0° C. in the presence of a Lewis acid, alkylsulfonic acid or toluenesulfonic acid, a compound of the above-described formula (4) is produced. As the solvent, aromatic hydrocarbon solvents such as toluene and the like or halogen-containing solvents such as dichloromethane and the like are used.

When the polymer compound of the present invention is used in a polymer LED and the like, the purity of the polymer compound exerts an influence on the device performances such as light emitting property and the like, thus, it is preferable to purify the monomer before polymerization by a method such as distillation, sublimation purification, re-crystallization and the like, then, to polymerize the monomer.

Further, it is preferable, after polymerization, to carry out a purification treatment such as re-precipitation purification, chromatographic fractionation and the like.

Examples will be shown below for illustrating the present invention further in detail, but the invention is not limited to them.

—Method of Measuring Number-Average Molecular Weight and Weight-Average Molecular Weight—

In the examples, the polystyrene-reduced number-average molecular weight and weight-average molecular weight were measured by gel permeation chromatography (GPC, manufactured by Shimadzu Corp., LC-10 Avp). A polymer to be measured was dissolved in tetrahydrofuran so as to give a concentration of about 0.5 wt %, and the solution was injected in an amount of 50 μL into GPC. Tetrahydrofuran was used as the mobile phase of GPC, and allowed to flow at a flow rate of 0.6 mL/min. In the column, two TSKgel Super HM-H (manufactured by Tosoh Corp.) and one TSKgel Super H2000 (manufactured by Tosoh Corp.) were connected serially. A differential refractive index detector (trade name RID-10A: manufactured by Shimadzu Corp.) was used as a detector.

Example 1

Synthesis of Compound C (Synthesis of Compound B)

A stirring bar was placed in a three-necked round-bottom flask (100 mL) which was then equipped with a condenser and thermo-couple. 3-bromobenzocyclobutane (4.1 g) and tetrahydrofuran (69 ml) were charged, and cooled down to −78° C. in a dry ice-acetone bath. n-BuLi (16.9 ml) was added and the mixture was stirred for 2 hours, and a solution prepared by dissolving compound A (4.1 g):

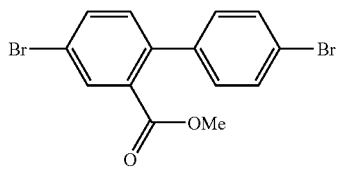

in tetrahydrofuran (12 ml) was dropped into the mixture. The mixture was stirred at −78° C. for 2 hours, then, further stirred for 4 hours at room temperature. Water (50 mL) was added slowly while cooling with an ice bath, and the mixture was transferred to a separatory funnel and washed, and further, washed twice with 30 ml of water. The resultant organic layer was dehydrated using magnesium sulfate, and the solid was filtrated and the solution was concentrated. As a result, 8.1 g of solid containing compound B:

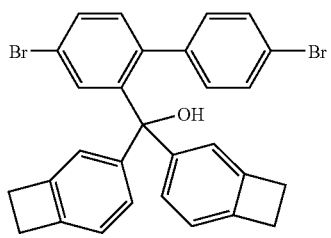 [SMILES: OC(c1ccc2c(c1)CC2)(c1ccc2c(c1)CC2)c1cc(Br)ccc1-c1ccc(Br)cc1]

was obtained (yield: 99.9%, LC purity: 73.0%).

(Synthesis of Compound C)

The compound B was charged in an round-bottom flask (100 mL), and dichloromethane (24 ml) was added to give a solution. The solution was cooled to 0° C. in an ice bath, then, BF$_3$Et$_2$O (7.0 mL) was dropped from a dropping funnel. After stirring for 1 hour, BF$_3$Et$_2$O (7.0 mL) was further added and the mixture was stirred for 1 hour, and stirred at room temperature for 5 hours. Water (100 mL) was added and the mixture was stirred, then, transferred to a separatory funnel, and extracted with chloroform (50 mL) three times. The resultant organic layer was dried over sodium sulfate, then, the solution was concentrated, and chloroform (30 mL) was added. Methanol (300 mL) was added while refluxing with heat to cause crystallization, and the resultant crystal was filtrated. This crystal was added to chloroform (20 mL) and heated, and methanol (200 mL) was added and the mixture was stirred at room temperature for 2 hours. The generated crystal was filtrated and dried. A targeted compound C:

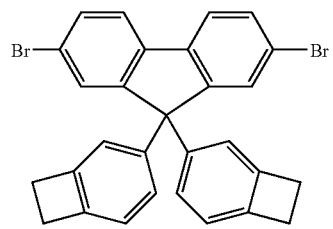 [SMILES: Brc1ccc2c(c1)C(c1ccc3c(c1)CC3)(c1ccc3c(c1)CC3)c1cc(Br)ccc1-2]

was obtained as white solid (2.0 g, yield: 35.0%, LC purity: 99.5%). The structure was determined according to the measurement results by $^1$H NMR.

$^1$H NMR (300 MHz, CDCl$_3$): δ7.56 (d, 8.1 Hz, 2H), 7.49 (d, 1.2 Hz, 2H), 7.45 (dd, 8.1, 1.2 Hz, 2H), 7.01 (d, 7.8 Hz, 2H), 6.92 (d, 7.8 Hz, 2H), 6.81 (s, 2H), 3.11 (s, 4H).

Example 2

Synthesis of Polymer 1

A stirring bar was placed in a 200 mL three-necked flask connected to Dimroth, and a condenser and thermo-couple were installed, and 0.536 g (1.0 mmol) of compound D:

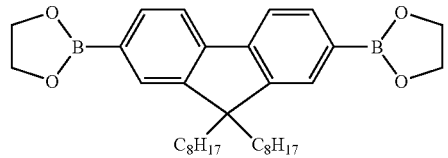

0.110 g (0.2 mmol) of compound E:

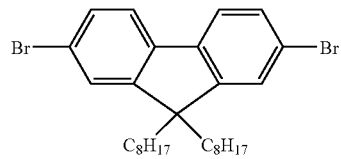

0.105 g (0.2 mmol) of compound C, 0.275 g (0.6 mmol) of compound F:

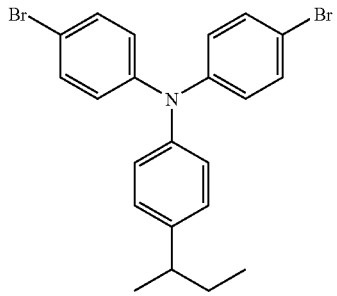 [SMILES: CCC(C)c1ccc(N(c2ccc(Br)cc2)c2ccc(Br)cc2)cc1]

and 10 mL of toluene were added. Under a nitrogen atmosphere, the monomer solution was heated up to 50° C. and, 0.4 mg of palladium acetate, 2.7 mg of tris(2-methoxyphenyl)phosphine and 3.4 g of 20 wt % tetraethylammonium hydroxide aqueous solution were poured. After heating up to 105° C., the mixture was stirred for 30 hours. Next, 89 mg of compound G:

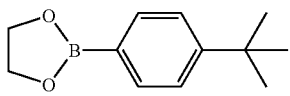

dissolved in 0.5 mL of toluene was added and the mixture was stirred at 105° C. for 2 hours. Further, 0.2 g of sodium N,N-diethylthiocarbamate trihydrate and 3 mL of ion exchanged water were added and the mixture was stirred at 65° C. for 2 hours.

The organic layer was separated from the aqueous layer, then, the organic layer was washed with about 20 mL of 2 M hydrochloric acid (once), about 20 mL of 10 wt % sodium acetate aqueous solution (once) and about 20 mL of ion exchanged. water (three times), in this order. The organic layer was dropped into about 270 mL of methanol to cause precipitation of polymer, and the precipitate was filtrated, then, dried to obtain solid. This solid was dissolved in about 30 mL of toluene, and the solution was allowed to pass through a silica gel/alumina column through which toluene had been passed previously, and this solution was dropped into about 270 mL of methanol to cause precipitation of polymer, and the precipitate was filtrated, then, dried to obtain 0.49 g of polymer 1.

The polystyrene-reduced number average molecular weight and weight average molecular weight of the polymer 1 were $Mn=3.2\times10^4$ and $Mw=7.8\times10^4$, respectively.

Based on the charging ratio of starting raw materials, the polymer 1 is estimated to contain the following units in a proportion shown below.

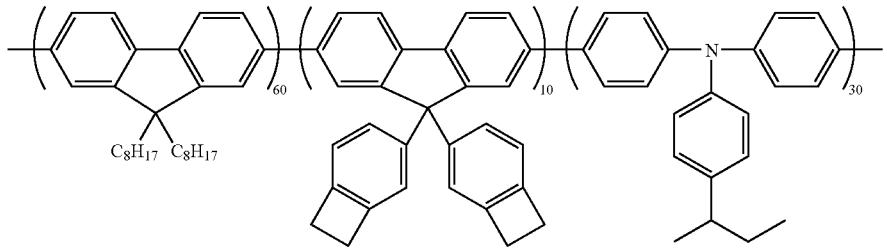

Synthesis Example 1

Synthesis of Polymer 2

Under an inert atmosphere, compound D (620 mg, 1.17 mmol) and compound H:

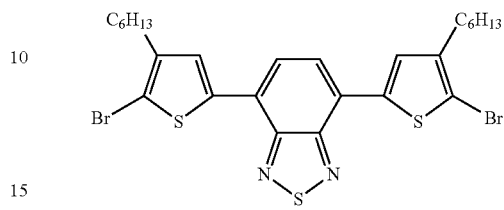

(733 mg, 1.17 mmol) were dissolved in toluene (21.6 g) and to this was added tetrakis(triphenylphosphine)palladium (27 mg, 0.0234 mmol), and the mixture was stirred at room temperature for 10 minutes. Subsequently, 4.2 g of tetraethylammonium hydroxide 20% aqueous solution was added and the temperature thereof was raised, and the mixture was heated under reflux for about 17 hours. After the reaction, phenylboronic acid (214 mg) was added, and the mixture was further heated under reflux for 1 hour. Thereafter, the mixture was cooled down to room temperature, and the reaction mass was dropped into methanol (204 ml), and the deposited precipitate was separated by filtration. The resultant precipitate was washed with methanol, and dried under reduced pressure, to obtain solid.

Next, the resultant solid was dissolved in toluene (51 ml), and the solution was allowed to pass through a column filled with silica and alumina, then, concentrated. The concentrated liquid was added to methanol (204 ml) and the mixture was stirred for 1 hour, and the deposited precipitate was separated by filtration. The resultant precipitate was washed with methanol, and dried under reduced pressure to obtain 780 mg of polymer 2.

The polystyrene-reduced number average molecular weight and weight average molecular weight of the polymer 2 were $Mw=8.3\times10^4$ and $Mn=3.7\times10^4$, respectively.

Based on the charging ratio of starting raw materials, the polymer 2 is estimated to contain the following units in a proportion shown below.

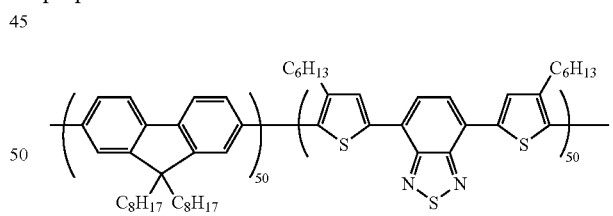

Example 3

Manufacturing of Light Emitting Device

On a glass substrate carrying thereon an ITO film with a thickness of 150 nm formed by a sputtering method, a suspension of poly(3,4)ethylenedioxythiophene/polystyrene-sulfonic acid (Baytron P AI4083, manufactured by Bayer) was spin-coated to form a film with a thickness of about 80 nm which was then dried on a hot plate at 200° C. for 10 minutes. Next, the polymer 1 was dissolved in xylene in a concentration of 1.5 wt %, and the resultant xylene solution was spin-coated to form a film with a thickness of about 20 nm. Under a nitrogen atmosphere in which both the oxygen concentration and the moisture concentration were 10 ppm or less (by weight), the film was dried at 180° C. for 15 minutes. Then, the polymer 2 was dissolved in xylene in a concentration of 1.5 wt %, and the resultant xylene solution was spin-coated to form a film with a thickness of about 80 nm. Under a nitrogen atmosphere in which both the oxygen concentration and the moisture concentration were 10 ppm or less (by weight), the film was dried at 130° C. for 1 hour. As a cathode, barium was vapor-deposited with a thickness of about 5 nm, then, aluminum was vapor-deposited with a thickness of about 80 nm, to manufacture a polymer light emitting device. The device constitution was ITO/Baytron P (about 80 nm)/polymer 1 (about 20 nm)/polymer 2 (about 80 nm)/Ba/Al. After the degree of vacuum reached $1 \times 10^{-4}$ Pa or lower, vapor deposition of metal was initiated.

When a voltage of 9.0 V was applied to the resultant polymer light emitting device, fluorescence was emitted showing a peak top of the fluorescence wavelength at 650 nm, and at this time point, the luminance was 972 cd/m². The light emission efficiency showed a maximum value of 0.155 cd/A at 6 V.

Synthesis Example 2

Into a 200 mL three-necked round-bottomed flask connected to Dimroth was added 1.60 g (3.0 mmol) of compound D, 0.66 g (1.2 mmol) of compound E, 0.83 g (1.8 mmol) of compound F and 23 ml of toluene. Under a nitrogen atmosphere, the monomer solution was heated up to 50° C., and 1.2 mg of palladium acetate, 9.5 mg of tris(2-methoxyphenyl-)phosphine and 10.2 g of 20 wt % tetraethylammonium hydroxide aqueous solution were poured After heating up to 105° C., the mixture was stirred for 4 hours. Next, 267 mg of the compound G dissolved in 1.5 mL of toluene was added and the mixture was stirred at 105° C. for 2 hours. Further, 0.6 g of sodium N,N-diethylthiocarbamate trihydrate and 9 mL of ion exchanged water were added and the mixture was stirred at 65° C. for 2 hours.

The organic layer was separated from the aqueous layer, then, the organic layer was washed with about 70 mL of 2 M hydrochloric acid (once), about 70 mL of 10 wt % sodium acetate aqueous solution (once) and about 70 mL of ion exchanged water (three times), in this order. The organic layer was dropped into about 800 mL of methanol to cause precipitation of polymer, and the precipitate was filtrated, then, dried to obtain solid. This solid was dissolved in about 90 mL of toluene, and the solution was allowed to pass through a silica gel/alumina column through which toluene had been passed previously, and this solution was dropped into about 800 mL of methanol to cause precipitation of polymer, and the precipitate was filtrated, then, dried to obtain 1.80 g of polymer 3.

The polystyrene-reduced number average molecular weight and weight average molecular weight of the polymer 3 were $Mn=9.9 \times 10^4$ and $Mw=2.4 \times 10^5$, respectively.

Based on the charging ratio of starting raw materials, the polymer 3 is estimated to contain the following units in a proportion shown below.

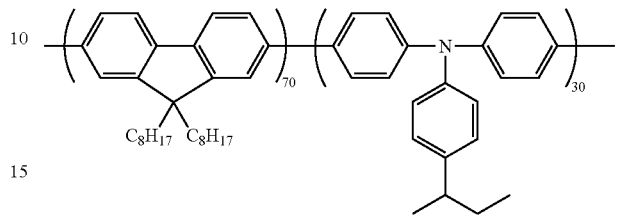

Comparative Example 1

Manufacturing of Light Emitting Device

The same procedure as in Example 3 was carried out excepting that the polymer 3 was used instead of the polymer 1 in Example 3, to manufacture a polymer light emitting device.

When a voltage of 9.0 V was applied to the resultant polymer light emitting device, fluorescence was emitted showing a peak top of the fluorescence wavelength at 650 nm, and at this time point, the luminance was 706 cd/m². The light emission efficiency showed a maximum value of 0.120 cd/A at 6 V.

Synthesis Example 3

Synthesis of Compound I

Into a three-necked reaction vessel (5 L) was charged 2.7-dibromo-9-fluorenone:

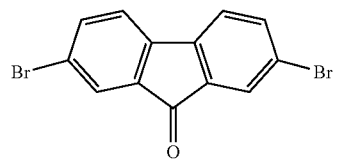 [SMILES: O=C1c2cc(Br)ccc2-c2ccc(Br)cc21]

(338 g, 1 mol), sodium 3-mercaptopropane-1-sulfonate (20 g, 0.1122 mol) and toluene (2.5 L). A thermo-couple and condenser were installed, and a mechanical stirrer and a stirring blade were installed. A dropping funnel charged with trifluoromethane sulfonic acid (165.01 g, 1.1 mol) was installed, and a nitrogen gas atmosphere was made. Stirring was performed at room temperature to obtain a slurry, and trifluoromethane sulfonic acid was dropped from the dropping funnel over a period of 53 minutes. The temperature was raised up to 45° C. over a period of 57 minutes, and this temperature was kept for 20 hours. IsoparC (2 L) was added and the mixture was cooled down to room temperature. The resultant slurry was filtrated under reduced pressure using a glass filter (content volume: 2 L), and washed with de-ionized water (1.25 L) and ethanol (500 mL), in this order. The resultant crystal was dried as it was in air, to obtain 432.7 g of coarse product. This was transferred to a 5 L reaction vessel, and a mechanical stirrer was installed, and activated carbon (40 g)

and dichloromethane (4 L) were added and the mixture was heated under reflux for 1 hour. This was hot-filtrated using a glass filter paved with silica gel, and washed with hot dichloromethane (1.5 L). The resultant dichloromethane solution was concentrated to 200 mL, and the generated crystal was filtrated and dried. The same treatment with activated carbon was repeated to obtain 389.82 g of compound I:

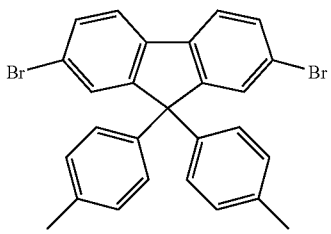 [SMILES: Cc1ccc(C2(c3ccc(C)cc3)c3cc(Br)ccc3-c3ccc(Br)cc32)cc1]

as white solid (yield: 77.3%). The structure was determined according to the measurement results by 1H NMR.

$^1$H NMR (300 MHz, CDCl$_3$): δ7.56 (d, 8.10 Hz, 2H), 7.47 (s, 2H), 7.45 (d, 8.10 Hz, 2H), 6.93-7.10 (m, 8H), 2.30 (s, 6H)

Synthesis Example 4

Synthesis of Compound J

A stirring bar was placed in a three-necked round-bottomed flask (300 mL), and a condenser and thermo-couple were installed. The compound I (10.0 g), bis(pinacolate)diborane (11.1 g), potassium acetate (11.7 g) and 1,4-dioxane (169 ml) were charged. The mixture was stirred at room temperature and, 1,1'-bis(diphenylphosphinoferrocene) dichloropalladium (0.97 g) and diphenylphosphinoferrocene were added and the mixture was heated up to 110° C., and stirred for 8 hours. After cooling down to room temperature, the solution filtrated was concentrated, and toluene was added to this to prepare a solution. The solution was passed through a glass filter packed with silica gel, then, concentrated. Toluene (50 mL) was added and heated to cause dissolution thereof, and methanol (150 mL) was added and the mixture was allowed to cool to room temperature. The generated crystal was filtrated and dried to obtain 9.8 g of the targeted compound J:

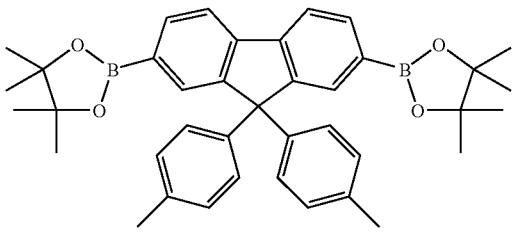

as pale yellow solid (yield: 84.3%, LC purity: 99.0%). The structure was determined according to the measurement results by $^1$H NMR.

$^1$H NMR (300 MHz, CDCl$_3$): δ7.74-7.85 (m, 6H), 7.05 (d, 7.58 Hz, 4H), 7.02 (d, 7.58 Hz, 4H), 2.28 (s, 6H), 1.30 (s, 24H).

Example 4

Method of Synthesis of Polymer 4

A stirring bar was placed in a 100 mL reaction tube and, compound J (1.1968 g, 0.0020 mmol), compound I (0.2017 g, 0.0004 mmol), compound C (0.2113 g, 0.0004 mmol), compound F (0.5511 g, 0.0012 mmol) and Aliquat 336 (0.26 g, 0.0006 mmol) were charged. Under a nitrogen atmosphere, toluene (20 mL) was added, and the mixture was heated up to 100° C. while stirring. Bis(triphenylphosphine)palladium (II) dichloride was charged and the mixture was stirred for 30 minutes, then, 17.5% sodium carbonate aqueous solution (5.4 ml) was dropped. The mixture was heated under reflux for 12 hours, and compound K

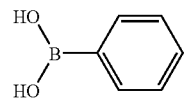

(0.0244 g, 0.0002 mmol) dissolved in 1 mL of toluene was added to this and the resultant mixture was stirred for 4 hours. The mixture was cooled down to 80° C., and a 9.2% sodium N,N-diethylthiocarbamate trihydrate aqueous solution was added and the mixture was stirred for 2 hours. The organic layer was separated from the aqueous layer, then, the organic layer was washed with ion exchanged water (26 ml, twice), 3% acetic acid water (26 ml, twice) and ion exchanged water (26 ml, twice), in this order. The organic layer was dropped into methanol (310 mL) to cause precipitation of polymer, and the precipitate was filtrated, then, dried to obtain solid. This solid was dissolved in toluene (62 mL), and the solution was allowed to pass through a silica gel/alumina column through which toluene had been passed previously, and this solution was dropped into methanol (310 mL) to cause precipitation of polymer, and the precipitate was filtrated, then, dried to obtain 1.05 g of polymer 4.

The polystyrene-reduced number average molecular weight and weight average molecular weight of the polymer 4 were Mn=7.8×10$^3$ and Mw=2.2×10$^4$, respectively.

Based on the charging ratio of starting raw materials, the polymer 4 is estimated to contain the following units in a proportion shown below.

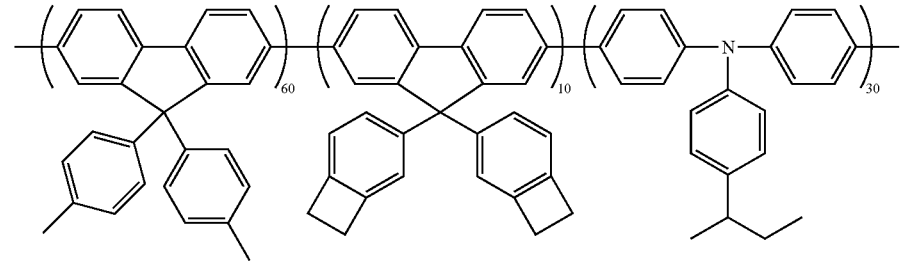

Example 5

Manufacturing of Light Emitting Device

The same procedure as in Example 3 was carried out excepting that the polymer 4 was used instead of the polymer 1 in Example 3, to manufacture a polymer light emitting device.

When a voltage of 9.0 V was applied to the resultant polymer light emitting device, fluorescence was emitted showing a peak top of the fluorescence wavelength at 665 nm, and at this time point, the luminance was 1050 cd/m$^2$. The light emission efficiency showed a maximum value of 0.141 cd/A at 6 V.

INDUSTRIAL APPLICABILITY

When the polymer compound of the present invention is used in a hole transporting layer in manufacturing a light emitting device, the resultant light emitting device shows excellent light emission efficiency (that is, light emission luminance per current), and further, when it is used in a light emitting layer, it can be laminated on the upper part of the light emitting layer by a solution application method. Further, a thin film and a laminate produced by heating the polymer compound of the present invention have a feature of excellent thermal stability. Thus, the polymer compound of the present invention is useful as a charge transporting material and a light emitting material.

Therefore, a light emitting device obtained by using the polymer compound of the present invention is useful for sheet light sources such as a curved light source, flat light source and the like (for example, for illumination and the like); displays such as segment displays (for example, segment type display and the like), dot matrix displays (for example, dot matrix flat display and the like), liquid crystal displays (for example, liquid crystal display, back light for liquid crystal display, and the like) and so on.

The polymer compound of the present invention is suitable as a material to be used for manufacturing of them, and additionally, also suitable as a coloring matter for laser, a material for organic solar cell, an organic semiconductor for organic transistor, a material for conductive thin film such as an electric conductive thin film, organic semiconductor thin film and the like, a material for luminous thin film emitting fluorescence, a material of polymer electric field effect transistor, or the like.

The invention claimed is:
1. A polymer compound having a repeating unit of the following formula (1-2):

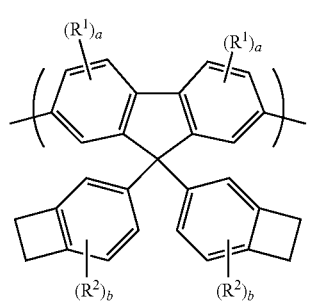

(1-2)

wherein R$^1$ and R$^2$ represents a substituent, and these may be the same or different; a and b represent each independently an integer of 0 to 3; and when there exist a plurality of R$^1$s and R$^2$s, respectively, these may be the same or different;

and a repeating unit of the following formula (2):

$$—Ar_1—\qquad(2)$$

wherein, Ar1 represents a divalent aromatic amine group; wherein the divalent aromatic amine group is selected from the group consisting of formula 127:

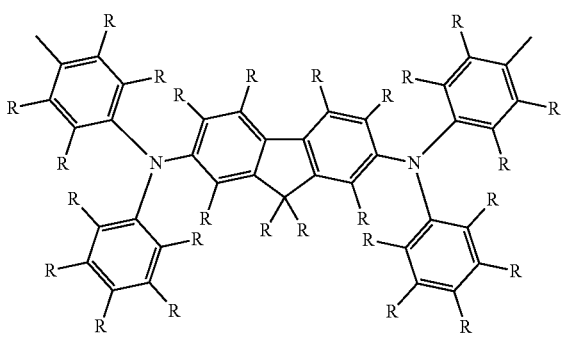

127 wherein each R independently represents a hydrogen atom or substituent, and wherein the polymer compound comprises the repeating unit of the formula (1-2), the divalent aromatic amine group, and the repeating unit of formula (3).

2. A polymer compound having a repeating unit of the following formula (1-2):

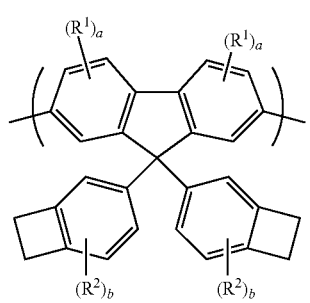

(1-2)

wherein R$^1$ and R$^2$ represent a substituent, and these may be the same or different; a and b represent each independently an integer of 0 to 3; and when there exist a plurality of R$^1$s and R$^2$s, respectively, these may be the same or different;

and a repeating unit of the following formula (2);

$$—Ar_1— \quad (2)$$

wherein, $Ar_1$ represents a divalent aromatic amine group or a repeating unit of the following formula (3):

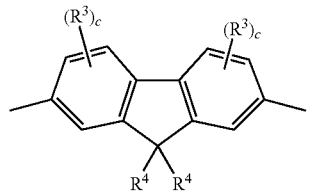

(3)

wherein $R^3$ represents a substituent; $R^4$ represents a hydrogen atom or a substituent (here, groups containing a benzocyclobutane structure are excluded); c represents an integer of 0 to 3; when there exist a plurality of $R^3$s, these may be the same or different; and two $R^4$s may be the same or different, wherein the divalent aromatic amine group is selected from the group consisting of formula 127:

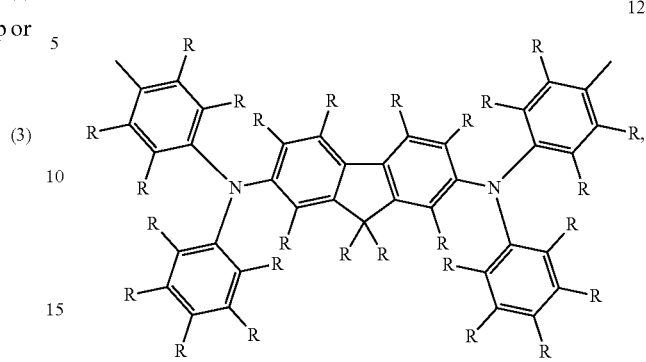

127 wherein each R independently represents a hydrogen atom or a substituent, and wherein the polymer compound comprises the repeating unit of the formula (1-2), the divalent aromatic amine group, and the repeating unit of formula (3).

* * * * *